United States Patent
Nondhasitthichai et al.

(10) Patent No.: US 8,704,381 B2
(45) Date of Patent: Apr. 22, 2014

(54) VERY EXTREMELY THIN SEMICONDUCTOR PACKAGE

(71) Applicant: UTAC Thai Limited, Bangkok (TH)

(72) Inventors: Somchai Nondhasitthichai, Bangkok (TH); Saravuth Sirinorakul, Bangkok (TH)

(73) Assignee: UTAC Thai Limited, Bangkok (TH)

( * ) Notice: Subject to any disclaimer, the term of this patent is extended or adjusted under 35 U.S.C. 154(b) by 0 days.

(21) Appl. No.: 13/970,392

(22) Filed: Aug. 19, 2013

(65) Prior Publication Data

US 2014/0015117 A1  Jan. 16, 2014

Related U.S. Application Data

(62) Division of application No. 11/788,496, filed on Apr. 19, 2007, now Pat. No. 8,575,762.

(60) Provisional application No. 60/795,929, filed on Apr. 28, 2006.

(51) Int. Cl.
  *H01L 23/48* (2006.01)
  *H01L 23/52* (2006.01)
  *H01L 29/40* (2006.01)

(52) U.S. Cl.
  USPC ............. 257/777; 257/686; 257/E25.006; 257/E25.013

(58) Field of Classification Search
  USPC ......... 257/666, 686, 687, 690, 734, 777, 778, 257/787, E23.06, E25.006, E25.013
  See application file for complete search history.

(56) References Cited

U.S. PATENT DOCUMENTS

| | | |
|---|---|---|
| 3,611,061 A | 10/1971 | Segerson |
| 4,411,719 A | 10/1983 | Lindberg |
| 4,501,960 A | 2/1985 | Jouvet et al. |
| 4,801,561 A | 1/1989 | Sankhagowit |
| 4,855,672 A | 8/1989 | Shreeve |
| 5,105,259 A | 4/1992 | McShane et al. |
| 5,195,023 A | 3/1993 | Manzione et al. |
| 5,247,248 A | 9/1993 | Fukunaga |
| 5,248,075 A | 9/1993 | Young et al. |
| 5,281,851 A | 1/1994 | Mills et al. |
| 5,396,185 A | 3/1995 | Honma et al. |
| 5,397,921 A | 3/1995 | Karnezos |
| 5,479,105 A | 12/1995 | Kim et al. |
| 5,535,101 A | 7/1996 | Miles et al. |
| 5,596,231 A | 1/1997 | Combs |
| 5,843,808 A | 12/1998 | Karnezos |
| 5,990,692 A | 11/1999 | Jeong et al. |

(Continued)

OTHER PUBLICATIONS

Michael Quirk and Julian Serda, Semiconductor Manufacturing Technology, Pearson Education International, Pearson Prentice Hall, 2001, pp. 587-588.

*Primary Examiner* — Hoai V Pham
(74) *Attorney, Agent, or Firm* — Haverstock & Owens LLP

(57) ABSTRACT

A package and method of making thereof. The package includes a first plated area, a second plated area, a die, a bond, and a molding. The die is attached to the first plated area, and the bond couples the die to the first and/or the second plated areas. The molding encapsulates the die, the bonding wire, and the top surfaces of the first and second plated areas, such that the bottom surfaces of the first and second plated areas are exposed exterior to the package.

12 Claims, 21 Drawing Sheets

(56) References Cited

U.S. PATENT DOCUMENTS

| | | |
|---|---|---|
| 6,072,239 A | 6/2000 | Yoneda et al. |
| 6,111,324 A | 8/2000 | Sheppard et al. |
| 6,159,770 A | 12/2000 | Tetaka et al. |
| 6,197,615 B1 | 3/2001 | Song et al. |
| 6,208,020 B1 | 3/2001 | Minamio et al. |
| 6,229,200 B1 | 5/2001 | Mclellan et al. |
| 6,242,281 B1 | 6/2001 | Mclellan et al. |
| 6,250,841 B1 | 6/2001 | Ledingham |
| 6,284,569 B1 | 9/2001 | Sheppard et al. |
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Karnezos et al. |
| 6,329,711 B1 | 12/2001 | Kawahara et al. |
| 6,353,263 B1 | 3/2002 | Dotta et al. |
| 6,372,625 B1 | 4/2002 | Shigeno et al. |
| 6,376,921 B1 | 4/2002 | Yoneda et al. |
| 6,392,427 B1 | 5/2002 | Yang |
| 6,414,385 B1 | 7/2002 | Huang et al. |
| 6,429,048 B1 | 8/2002 | McLellan et al. |
| 6,451,709 B1 | 9/2002 | Hembree |
| 6,455,348 B1 | 9/2002 | Yamaguchi |
| 6,489,218 B1 | 12/2002 | Kim et al. |
| 6,498,099 B1 | 12/2002 | McLellan et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,667,191 B1 | 12/2003 | McLellan et al. |
| 6,683,368 B1 | 1/2004 | Mostafazadeh |
| 6,686,667 B2 | 2/2004 | Chen et al. |
| 6,703,696 B2 | 3/2004 | Ikenaga et al. |
| 6,723,585 B1 | 4/2004 | Tu et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,764,880 B2 | 7/2004 | Wu et al. |
| 6,781,242 B1 | 8/2004 | Fan et al. |
| 6,800,948 B1 | 10/2004 | Fan et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,894,376 B1 | 5/2005 | Mostafazadeh et al. |
| 6,897,428 B2 | 5/2005 | Minamio et al. |
| 6,927,483 B1 | 8/2005 | Lee et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 1/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,049,177 B1 | 5/2006 | Fan et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,205,178 B2 | 4/2007 | Shiu et al. |
| 7,224,048 B1 | 5/2007 | McLellan et al. |
| 7,247,526 B1 | 7/2007 | Fan et al. |
| 7,259,678 B2 | 8/2007 | Brown et al. |
| 7,274,088 B2 | 9/2007 | Wu et al. |
| 7,314,820 B2 | 1/2008 | Lin et al. |
| 7,315,077 B2 | 1/2008 | Choi et al. |
| 7,315,080 B1 | 1/2008 | Fan et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,405,468 B2 * | 7/2008 | Masuda et al. ............... 257/676 |
| 7,408,251 B2 | 8/2008 | Hata et al. |
| 7,411,289 B1 | 8/2008 | McLellan et al. |
| 7,449,771 B1 | 11/2008 | Fan et al. |
| 7,482,690 B1 | 1/2009 | Fan et al. |
| 7,495,319 B2 | 2/2009 | Fukuda et al. |
| 7,595,225 B1 | 9/2009 | Fan et al. |
| 7,608,484 B2 | 10/2009 | Lange et al. |
| 7,709,857 B2 | 5/2010 | Kim et al. |
| 7,714,418 B2 | 5/2010 | Lim et al. |
| 2001/0007285 A1 | 7/2001 | Yamada et al. |
| 2002/0109214 A1 | 8/2002 | Minamio et al. |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2003/0234454 A1 | 12/2003 | Pedron et al. |
| 2004/0014257 A1 | 1/2004 | Kim et al. |
| 2004/0026773 A1 | 2/2004 | Koon et al. |
| 2004/0046237 A1 | 3/2004 | Abe et al. |
| 2004/0046241 A1 | 3/2004 | Combs et al. |
| 2004/0070055 A1 | 4/2004 | Punzalan et al. |
| 2004/0080025 A1 | 4/2004 | Kasahara et al. |
| 2004/0110319 A1 | 6/2004 | Fukutomi et al. |
| 2005/0003586 A1 | 1/2005 | Shimanuki et al. |
| 2005/0077613 A1 | 4/2005 | McLellan et al. |
| 2005/0236701 A1 | 10/2005 | Minamio et al. |
| 2005/0263864 A1 | 12/2005 | Islam et al. |
| 2006/0071351 A1 | 4/2006 | Lange |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0273433 A1 | 12/2006 | Itou et al. |
| 2007/0001278 A1 | 1/2007 | Jeon et al. |
| 2007/0013038 A1 | 1/2007 | Yang |
| 2007/0029540 A1 | 2/2007 | Kajiwara et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2009/0152694 A1 | 6/2009 | Bemmert et al. |
| 2009/0230525 A1 | 9/2009 | Cahng Chien et al. |
| 2009/0236713 A1 | 9/2009 | Xu et al. |
| 2010/0133565 A1 | 6/2010 | Cho et al. |
| 2010/0149773 A1 | 6/2010 | Said |
| 2010/0178734 A1 | 7/2010 | Lin |
| 2010/0224971 A1 | 9/2010 | Li |
| 2011/0115061 A1 | 5/2011 | Krishnan et al. |
| 2011/0201159 A1 | 8/2011 | Mori et al. |

* cited by examiner

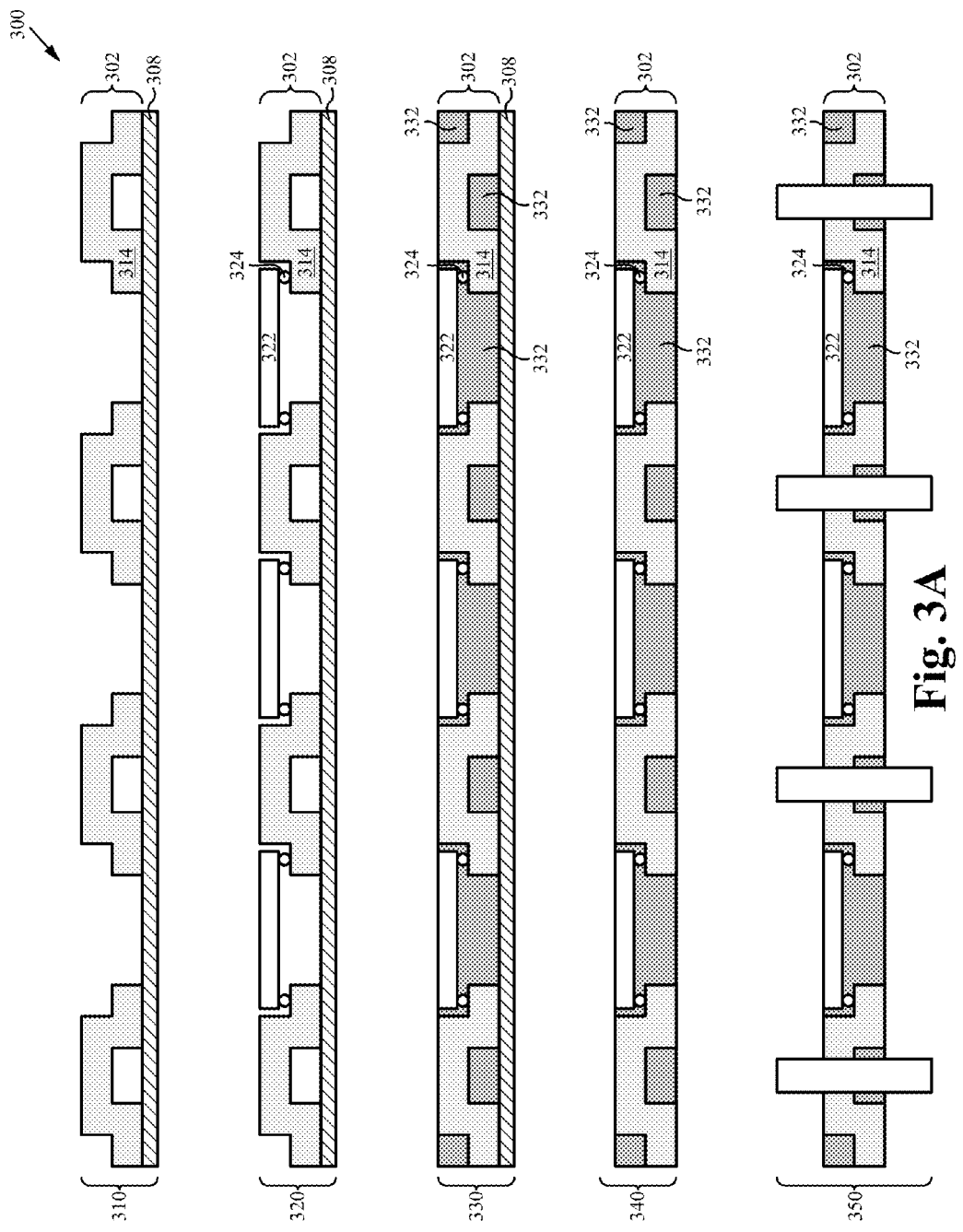

VERY EXTREMELY THIN SEMICONDUCTOR PACKAGE

RELATED APPLICATIONS

This application is a divisional of co-pending U.S. patent application Ser. No. 11/788,496, filed on Apr. 19, 2007, and entitled "Very Extremely Thin Semiconductor Package," which in turn claims benefit of priority under 35 U.S.C. section 119(e) of U.S. Provisional Patent Application 60/795,929, filed Apr. 28, 2006, and entitled "Lead Frame Land Grid Array." This application incorporates U.S. patent application Ser. No. 11/788,496, filed on Apr. 19, 2007, and entitled "Very Extremely Thin Semiconductor Package," and U.S. Provisional Patent Application 60/795,929, filed Apr. 28, 2006, and entitled "Lead Frame Land Grid Array" in their entirety by reference.

FIELD OF THE INVENTION

The present invention is related to the field of semiconductor packaging. More specifically, the present invention is directed to a thin semiconductor package. In particular, the package is substantially the thickness of the lead frame.

BACKGROUND OF THE INVENTION

Many applications for using semiconductor devices are becoming increasingly smaller and lighter for enhanced portability. Common examples of such applications include small electronic devices such as cell phones, PDAs, and portable MP3 players. Conventional semiconductor device packages include a lead frame on which a semiconductor die is mounted. Wire bonds are coupled between the semiconductor die and leads of the lead frame. A resin material is molded to surround the die, wire bonds and lead frame while exposing electrical contacts to the lead frame to form a plastic package. In conventional packages, the molded resin is typically much thicker than the lead frame. Owing in part to the volume and thickness of the resin in these conventional packages, the resulting electronic device is larger and heavier than desired.

Additionally, the market for semiconductor devices is highly competitive. A portion of the cost of a semiconductor device is related to the amount of material present in the package. A package that uses less material can be more competitively priced than another package that uses more material.

There is a need for smaller, thinner and lighter packages for semiconductor devices. There is a further need for semiconductor device packages that use less material.

BRIEF SUMMARY OF THE INVENTION

A package is provided for a semiconductor die. The package includes a formed lead frame. The lead frame has a plurality of formed leads. The leads have a first end positioned near but spaced apart from the first semiconductor die. The first ends of the leads are substantially in a first planar level. The second end of each lead is higher than the first end and substantially in a second planar level wherein the second planar level is higher than the first planar level. Pads on the semiconductor die are electrically coupled to one or more of the first end of the leads. A resin is formed around the first semiconductor die and between the leads such that the package has a thickness substantially equal to the thickness of the lead frame. The package and the lead frame have a thickness in the range of 127 to 500 micro meters.

Several embodiments are provided for mounting the semiconductor die into the package. The semiconductor die can be inverted and flip chip bonded to one or more of the first ends. The back of the flip chip mounted semiconductor die can be exposed or covered with resin. The semiconductor die can be wire bonded to the first ends. In that case, the back side of the semiconductor die can be exposed from the package. Alternatively, the semiconductor die can be mounted to a die attach pad which is exposed.

At least two semiconductor die can be stacked within the package. In this case, the two or more die are each wire bonded to appropriate leads. Also, two or more packages can be stacked on top of one another. In that case, the exposed leads are aligned so that the stacked packages are electrically coupled together to form a system.

A portion of the leads can be plated to enhancing bonding of bond wires or for flip chip bonding. A portion of the leads can also be plated to enhance board soldering of the package.

The package is formed by a new method. In particular, the lead frame is formed by the steps of forming a photoresist mask on a lead frame block. Conventional masking steps can be used. Next, the lead frame block is etched at least half way through to form the lead frame. Then, the photoresist mask is removed. Finally, a tape is applied to the lead frame. The tape enhances subsequent processing.

BRIEF DESCRIPTION OF THE SEVERAL VIEWS OF THE DRAWINGS

The novel features of the invention are set forth in the appended claims. However, for purpose of explanation, several embodiments of the invention are set forth in the following figures.

FIG. 3A illustrates an exemplary result for each step in the process of FIG. 3.

More specifically, FIG. 4 illustrates a package that has an exposed die pad and leads that are exposed top and bottom.

FIG. 5 illustrates the package of FIG. 4 with the die on top of an adhesive layer.

FIG. 6 illustrates the package of FIG. 5 with the adhesive coupling the die to a die pad.

FIG. 7 illustrates a flip chip style package with the die coupled to the leads via solder balls, and the opposite surface of the die exposed at the top of the package.

FIG. 8 illustrates the flip chip package of FIG. 7, without the die exposed.

FIG. 9 illustrates the package of FIG. 7, with a (top) exposed die that is coupled via solder balls to a die pad exposed at the bottom of the package.

FIG. 10 illustrates the package of FIG. 9, where the die is not exposed at the top of the package.

FIG. 11 illustrates a stacked die implementation with top and bottom exposed leads wire bonded to the dice.

FIGS. 12-25 illustrate stacked or package-on-package (PoP) implementations employing some of the packages described above.

In particular, FIG. 12 illustrates two of the packages of FIG. 4 in a stacked or package-on-package configuration.

FIG. 13 illustrates two of the packages of FIG. 5 in a stacked configuration.

FIG. 14 illustrates the package of FIG. 5 stacked on top of another package of FIG. 5, but that has been inverted such that the bottom of the first package abuts the bottom of the second package.

FIG. 15 illustrates two of the packages of FIG. 6 in a stacked configuration.

FIG. 16 illustrates an inverted package of FIG. 6 stacked on top of an uninverted package of FIG. 6 such that the top surfaces of the two packages are abutting.

FIG. 17 illustrates the package of FIG. 4 stacked on top of the package of FIG. 5.

FIG. 18 illustrates the package of FIG. 7 stacked on top of the package of FIG. 6.

FIG. 19 illustrates the package of FIG. 9 stacked on top of the package of FIG. 6.

FIG. 20 illustrates the package of FIG. 6 inverted and stacked on top of the package of FIG. 9 such that the top surfaces of the two packages are abutting.

FIG. 21 illustrates the package of FIG. 6 inverted and stacked on top of the inverted package of FIG. 9.

FIG. 22 illustrates the package of FIG. 6C stacked on top of the package of FIG. 6.

FIG. 23 illustrates the package of FIG. 6D stacked on top of the package of FIG. 6.

FIG. 24 illustrates the package of FIG. 6D stacked on top of the package of FIG. 5.

FIG. 25 illustrates the package of FIG. 6C stacked on top of the package of FIG. 6.

In particular, FIG. 28 illustrates a method by which some embodiments produce the package illustrated in FIG. 4.

FIG. 28A illustrates a method by which some embodiments form the package illustrated in FIG. 4A.

FIG. 28B illustrates a method by which some embodiments form the package illustrated in FIG. 4B.

DETAILED DESCRIPTION OF THE INVENTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

I. Method

A. Lead Frame with Die Pad

Figure 1:
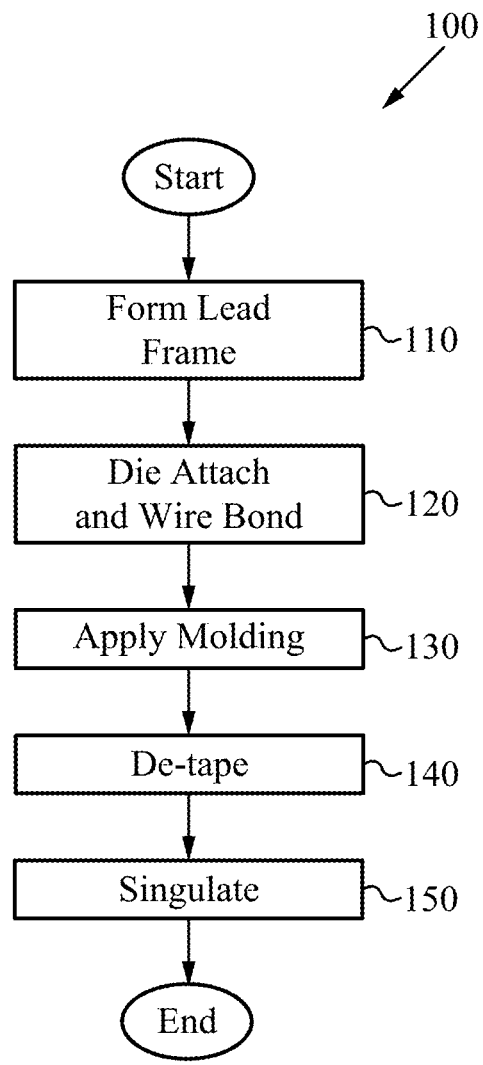
FIG. 1 illustrates a process according to some embodiments of the invention.
Figure 1A:
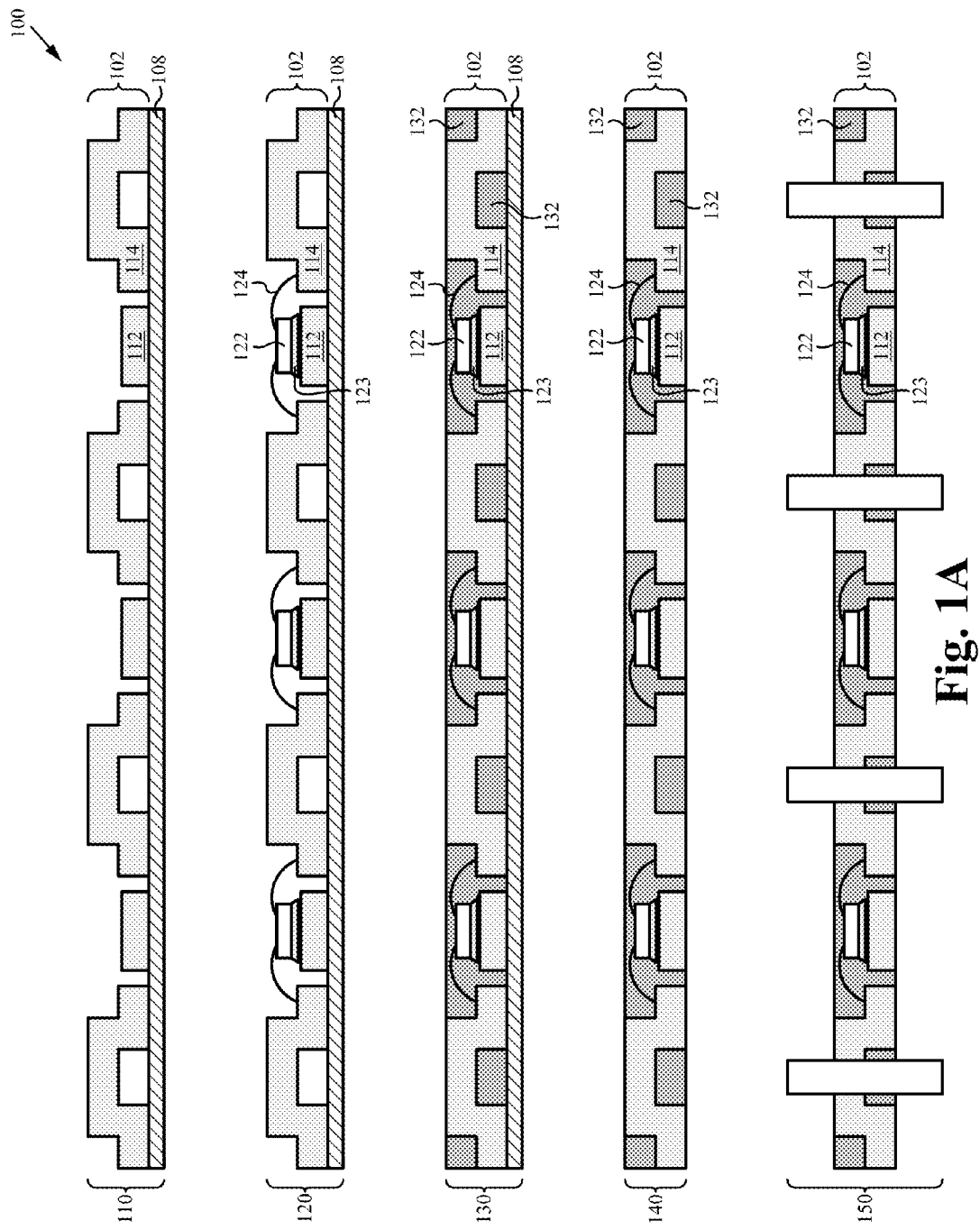
FIG. 1A illustrates an exemplary result for each step in the process of FIG. 1.

FIG. 1 illustrates a process 100 for manufacturing a semiconductor package according to some embodiments of the invention. FIG. 1A illustrates an exemplary result for each step in the process 100 of FIG. 1. As shown in these figures, the process 100 begins at the step 110, where a lead frame 102 is formed. A process for forming the lead frame is described below relative to FIG. 2B. The lead frame 102 typically comprises copper, Alloy 42, or another suitable material, and has a typical thickness in the range of 127 to 500 micro meters. Optionally, the lead frame, or a portion of the lead frame can be plated. Such plating preferably improves strength, bonding, electrical conductivity, and/or thermal transfer. As shown in FIG. 1A, the desired shape of the lead frame 102 is typically formed and then placed on a tape 108.

The lead frame 102 includes a die attach pad 112 and one and typically more leads 114. The die attach pad 112 is preferably substantially planar and has a bottom surface and a top surface. The top surface of the die attach pad 112 is adapted to receive a semiconductor die 122. Each lead 114 includes a first end that is formed in the first planar level and is substantially coplanar with the die attach pad 112. The leads 114 are formed to include a step, tiered, and/or a multi level formed shape. Each lead 114 includes a second end that is at a higher level than the die attach pad 112. Preferably, the step is formed using photoresist and a partial etch process, usually a half etch. As discussed further below, these shapes have particular advantages.

Regardless of the manner in which the lead frame 102 is formed, after the step 110, the process 100 transitions to the step 120, where die attach and/or wire bonding occur. As mentioned above, the lead frame 102 typically includes areas for a die pad 112 and/or a lead 114. As shown in FIG. 1A, die attach typically includes coupling a die 122 to the die attach pad 112 by using an adhesive 123, while wire bonding includes using a wire 124 to couple the die 122 to the die pad 112 and/or one or more leads 114.

After die attach and/or wire bonding occur at the step 120, the process 100 transitions to the step 130, where a molding 132 is applied. Typically the molding 132 includes a plastic polymer or resin that encapsulates the die 122, the wire bonds 124, and up to the top surface of the lead frame 102, including the die pad 112 and/or the leads 114.

Once the molding 132 is applied at the step 130, the process 100 transitions to the step 140, where the tape 108 is removed. When the tape 108 is removed, the bottom surfaces of the lead frame 102, including the die pad 112, and/or the leads 114, are typically exposed.

After the de-taping step 140, the process 100 transitions to the step 150, where individual package units contained within the molded strip are singulated to form individual semiconductor packages. Then, the process 100 concludes. The singulation step of particular embodiments are described further below in relation to FIG. 28. Portions of the leads 114 that are coplanar with the die attach pad 112 are exposed through the bottom of the package and those portions of the leads 114 that are raised and remain after the singulation step are exposed at the top of the package. Thus, the package is only as thick as the lead frame. The thickness of the lead frame is preferably in the range of 127 to 500 micro meters. This is a much thinner package than any conventional package.

B. Lead Frame without Die Pad

Figure 2:
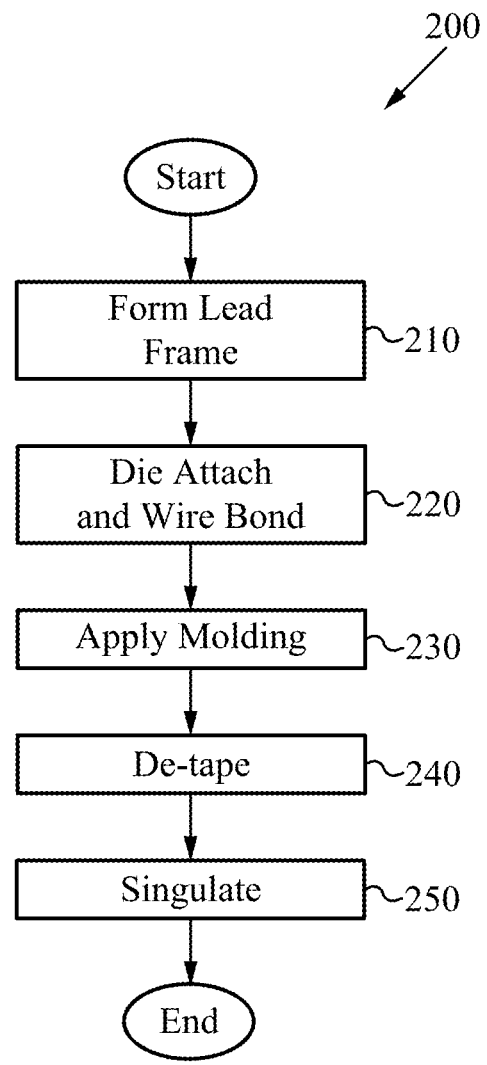
FIG. 2 illustrates a process that includes a step of forming a lead frame without a die pad according to some embodiments.
Figure 2A:
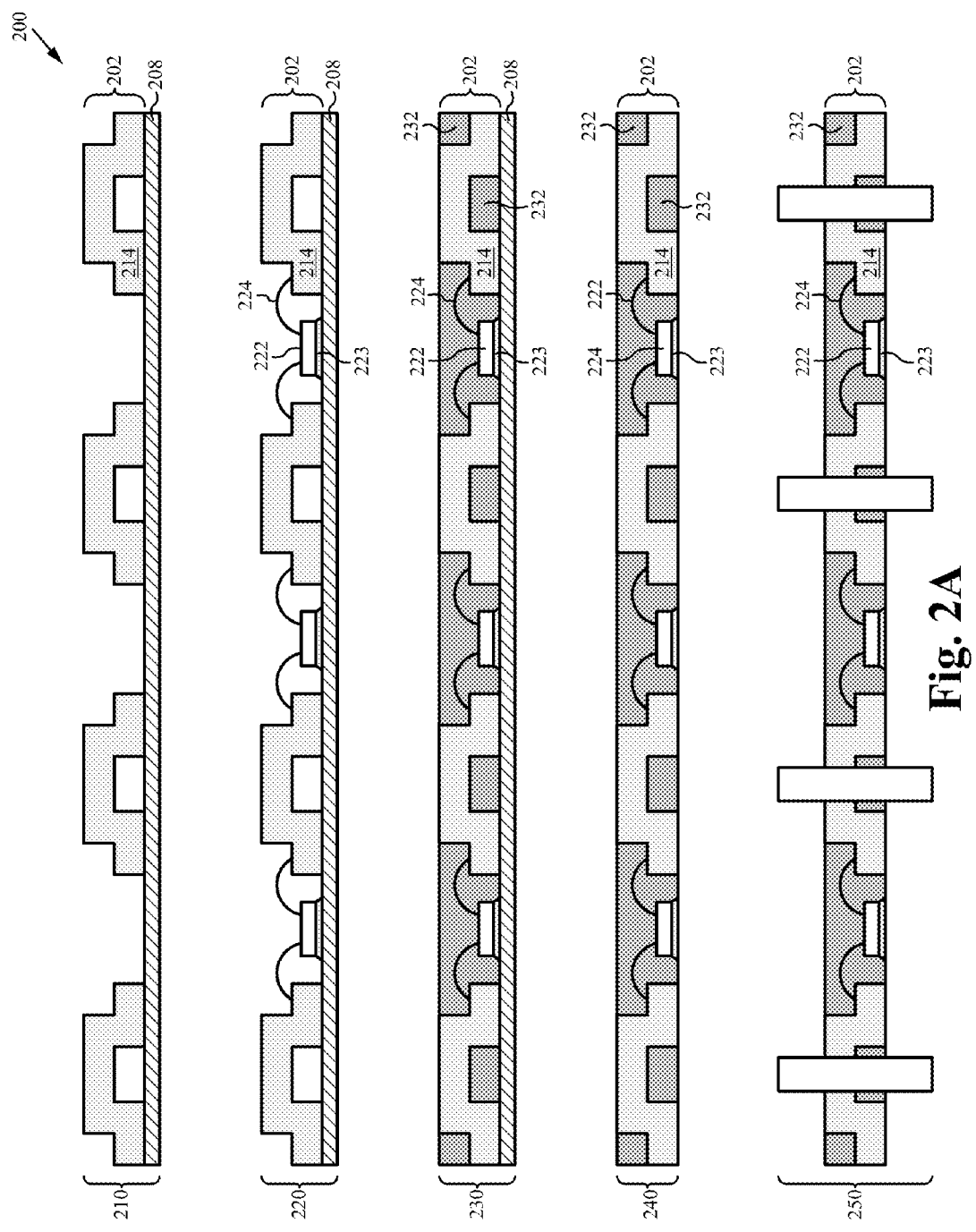
FIG. 2A illustrates an exemplary result for each step in the process of FIG. 2.

FIG. 2 illustrates a process that includes a step 210 for forming a lead frame 202 without a die pad according to some embodiments. FIG. 2A illustrates an exemplary result for each step in the process of FIG. 2. As shown in these figures, the process 200 begins at the step 210, where a lead frame 202 is formed. The lead frame 202 typically comprises copper, Alloy 42, or another suitable material. Similar to the step 110 of FIG. 1 above, forming the lead frame 202 optionally includes plating one or more areas of the lead frame 202. As shown in FIG. 2A, the particular shape of the lead frame 202 is typically formed and then placed on a tape 208.

Also shown in FIG. 2A, the lead frame 202 of some embodiments includes one or more leads 214, but does not include a die attach pad. In this manner, the process 200 and lead frame 202 of FIG. 2 differ from the process 100 and lead frame 102 of FIG. 1. However, similar to FIG. 1, the lead 214 portion of the lead frame 202 in FIG. 2, additionally includes a step, tiered, and/or a multi level formed shape. The step is preferably formed using a photoresist and partial etch process. After the lead frame 202 is formed with leads 214, but without die pads, a tape layer 208 is attached.

Figure 2B:
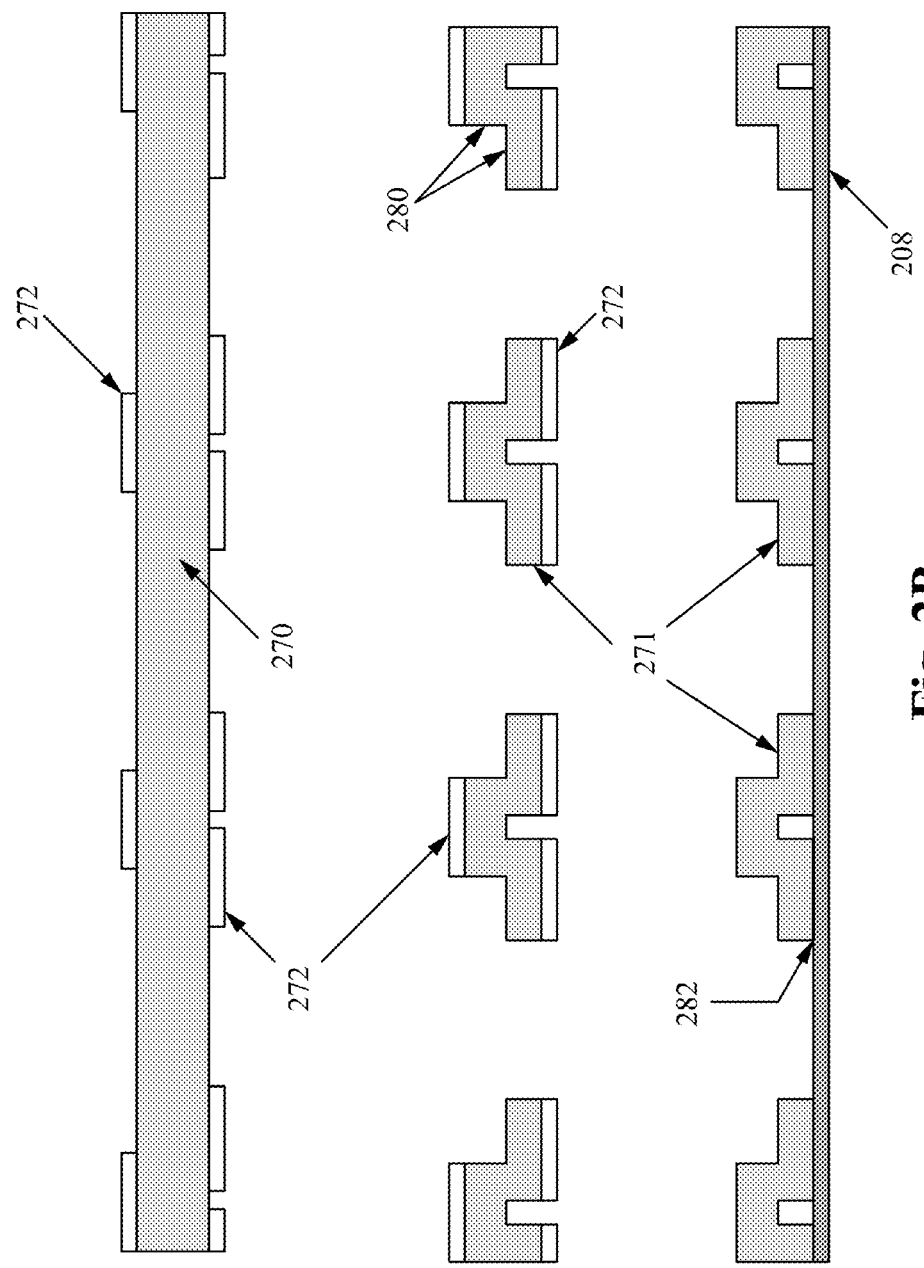
FIG. 2B illustrates and exemplary process for forming a lead frame according to the several embodiments of the present invention.

FIG. 2B shows a process for forming the lead frame 202. This process can be applied for forming the lead frame for any of the embodiments of this invention. A lead frame block 270 of copper, alloy or another suitable material is provided. The lead frame block 270 is preferably in the range of 127 to 500 micro meters thick. Using a conventional photoresist process, a photoresist material is applied to each surface of the lead frame block 270. The photoresist is masked, exposed, and developed in the usual manner to form photoresist mask elements 272. Through the photoresist mask elements 272, the lead frame block 270 is etched to a portion of its thickness, and preferably at least half its thickness is removed. Preferably, the etch is a wet etch process and forms the lead frame 271.

Portions of the lead from 271 can optionally be plated to enhance bonding. The regions 280 shown in FIG. 2B can be plated with Ag to at least 1.27 micro meters for bonding. Alternatively, the regions 280 can be plated with a three layer plating of Ni to at least 0.5 micro meters, Pd to at least 0.01 micro meters and Au to at least 30 Angstroms can be used in place of the Ag for bonding. The plating to enhance bonding is typically formed after the leads are formed.

Likewise, portions of the lead frame can optionally be plated to enhance soldering to a circuit board. The regions 282 can be plated with tin-lead to at least 7.62 micro meters for board soldering. Alternatively, the regions 282 can be plated with matte tin to at least 7.62 micro meters for board soldering. As a third alternative, the regions 282 can be plated with a three layer plating of Ni to at least 0.5 micro meters, Pd to at least 0.01 micro meters and Au to at least 30 Angstroms can be used in place of the Ag for board soldering. These platings and alternatives can be applied for forming the plated regions for any of the embodiments of this invention. The plating to enhance board soldering is preferably performed after the package is fully formed and the tape 208 is removed.

Hence, regardless of the manner in which the lead frame 202 is formed, after the step 210, the process 200 transitions to the step 220, where a semiconductor die 222 is attached to the tape 208 preferably with an adhesive 223. Then wire bonds 224 are coupled between the semiconductor die 222 and the leads 214. As mentioned above, the lead frame 202 typically includes areas for leads 214, but not die pads. Advantageously, because of the low position of the die 222 in relation to the leads 214, the thickness of the package is the thickness of the lead frame 202.

After die attach and/or wire bonding occur at the step 220, the process 200 transitions to the step 230, where a molding 232 is applied. Typically the molding 232 includes a plastic polymer or resin that encapsulates the die 222, the wire bonds 224, and the top surface of the lead frame 202, including the leads 214.

Once the molding 232 is applied at the step 230, the process 200 transitions to the step 240, where the tape 208 is removed. When the tape 208 is removed, the bottom surfaces of the die adhesive 223 and the lead frame 202, including the leads 214, are typically exposed.

After the de-taping step 240, the process 200 transitions to the step 250, where individual package units contained within the molded strip are singulated to form individual semiconductor packages. Then, the process 200 concludes. As mentioned above, singulation is discussed in further detail in relation to FIG. 28. Thus, the package is only as thick as the lead frame. The thickness of the lead frame is preferably in the range of 127 to 500 micro meters.

C. Flip Chip (by Using Solder Balls Instead of Bond Wires)

Figure 3:
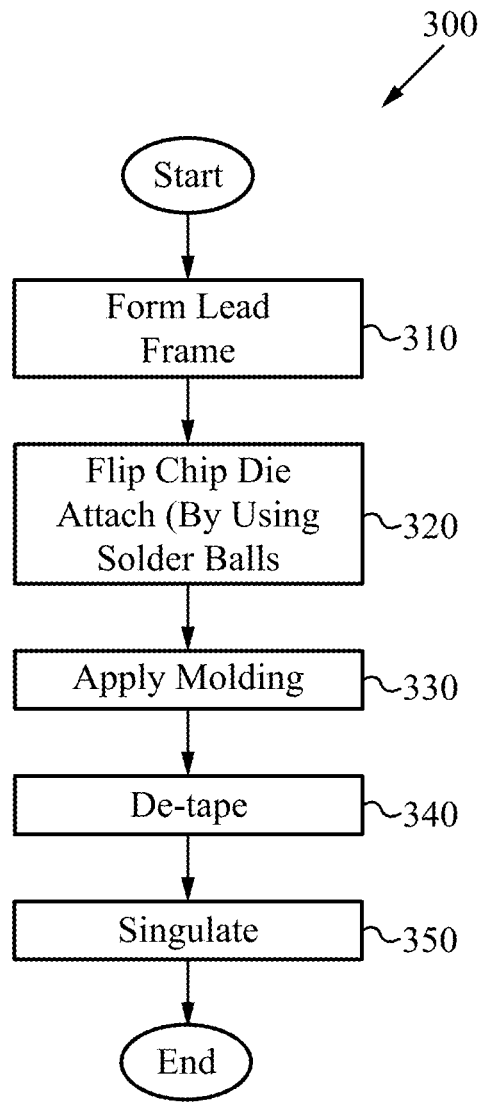
FIG. 3 illustrates a flip chip process according to some embodiments.

FIG. 3 illustrates a flip chip process according to some embodiments. FIG. 3A illustrates an exemplary result for each step in the process of FIG. 3. As shown in these figures, the process 300 begins at the step 310, where a lead frame 302 is formed. The lead frame 302 typically comprises copper, Alloy 42, or another suitable material, and has a typical thickness in the range of 127 to 500 micro meters. Similar to the step 210 of FIG. 2 above, forming the lead frame 302 optionally includes plating one or more areas of the lead frame 302. As shown in FIG. 3A, the particular shape of the lead frame 302 is typically formed and then placed on a tape 308.

Also shown in FIG. 3A, the lead frame 302 of some embodiments includes one or more leads 314, but no die attach pad(s). Similar to FIG. 2, the lead 314 portion of the lead frame 302 in FIG. 3, additionally includes a step, tiered, and/or a multi level formed shape. Accordingly, at the step 310, the process 300 and lead frame 302 of FIG. 3, are similar to the process 200 and lead frame 202 of FIG. 2, at the step 210. However, after the step 310, the process 300 and the process 200 differ. Thus, after the lead frame 302 is formed with lead(s) 314, but no die pad(s), the process 300 continues with steps that are different to the process 200 described above.

Accordingly, regardless of the manner in which the lead frame 302 is formed, after the step 310, the process 300 transitions to the step 320, where die attach occurs. As mentioned above, the lead frame 302 typically includes areas for leads 314, but not die pads. Accordingly, as shown in FIG. 3A, die attach typically includes coupling a die 322 directly to the lead(s) 314 by using solder balls 324, in a flip chip style. Thus, as illustrated in the figure, no wire bonding is needed. Accordingly, some embodiments have no need for additional bond wire clearance above the die, which can further reduce the overall height of the package.

After die attach and/or wire bonding occur at the step 320, the process 300 transitions to the step 330, where a molding 332 is applied. Typically the molding 332 includes a plastic polymer or resin that encapsulates the die 322, the solder balls 324, and the top surfaces of the lead frame 302, including the leads 314.

Once the molding 332 is applied at the step 330, the process 300 transitions to the step 340, where the tape 308 is removed. When the tape 308 is removed, the bottom surfaces of the lead frame 302, including the leads 314, are typically exposed.

After the de-taping step 340, the process 300 transitions to the step 350, where individual package units contained within the molded strip are singulated to form individual (flip chip style) semiconductor packages. Then, the process 300 concludes. Singulation is further described in relation to FIG. 28. Thus, the package is only as thick as the lead frame. The thickness of the lead frame is preferably in the range of 127 to 500 micro meters.

One of ordinary skill recognizes variations for the processes 100, 200, and 300 of FIGS. 1-1A, 2-2A, and 3-3A, respectively. For instance, a die pad is optionally formed along with the leads 314 in the step 310 of FIG. 3. In these embodiments, the step 320 further includes optionally bonding the die 322 to the die pad, by using one or more solder balls in a flip chip style, and/or by using one or more wire bonds. These process variations are further understood in view of the many exemplary package products discussed in the following section.

II. Exemplary Package Configurations

Figure 4:
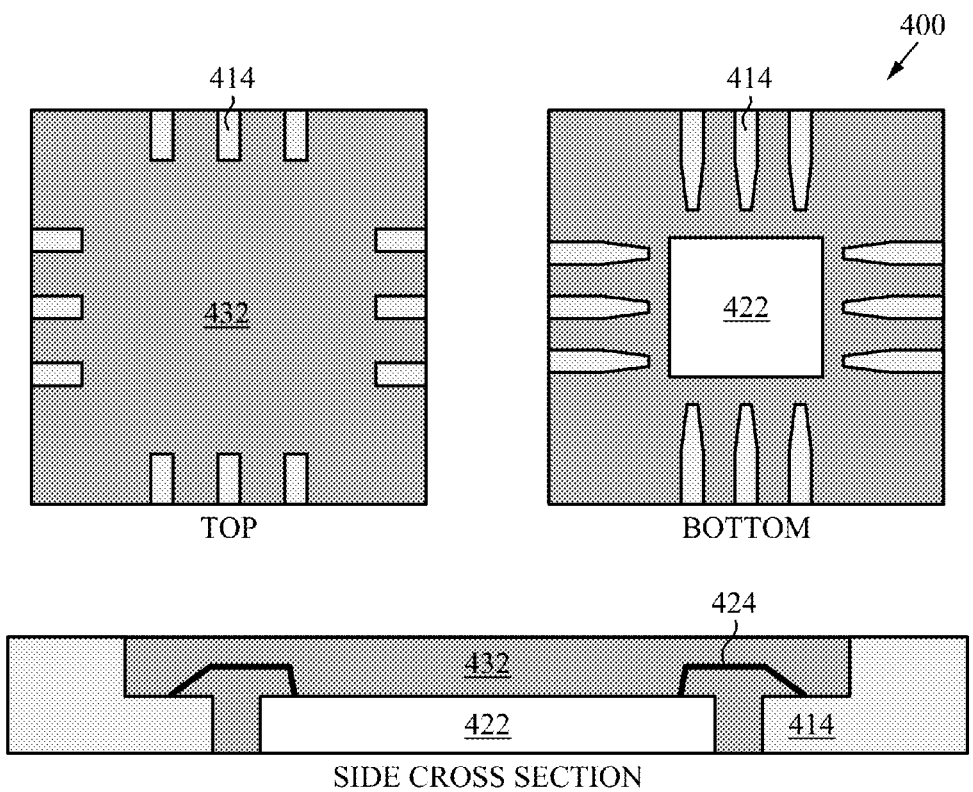
FIGS. 4-25 illustrate exemplary products of the method of some embodiments.

FIGS. 4-11 illustrate exemplary packages produced by the methods of the embodiments in further detail. More specifically, FIG. 4 illustrates a package 400 that has an exposed die 422 and leads 414 that are exposed at the top and bottom of the package 400. Since the package 400 has no die attach pad 412, some embodiments produce the package 400 by using a variation of the process 200 described above in relation to FIGS. 2 and 2A. As shown in FIG. 4, the package 400 includes no die attach pad(s), and no die adhesive. Thus, the die 422 is exposed directly at the bottom of the package 400, and the only other contribution to the total height of the package 400 is the bond wires 424 that couple the die 422 to the leads 414. As shown in the figure, the lead(s) 414 of this embodiment includes a step or a multi tier structure such that the height of the lead 414 matches the height of the die 422 and the bond wire 424, and does not add or contribute to the height of the package 400. In particular, a first tier of the lead 414 approximates the height of the die 422, while a second tier approximates a clearance height required for the bond wire 424 to couple the die 422 to the lead 414. Moreover, the bond wire(s) 424 further comprise a low profile design, such as by including bend angles, for example, that advantageously minimize their height.

Figure 4A:
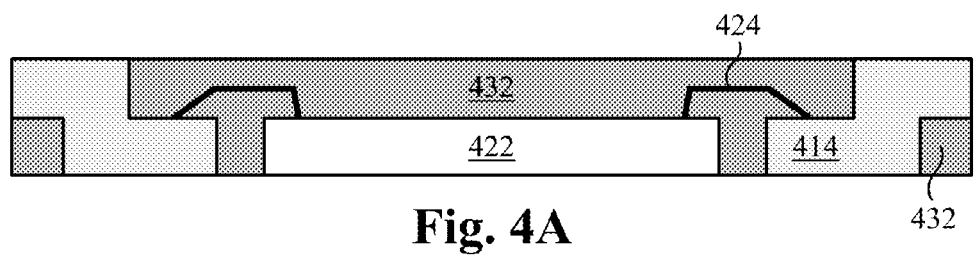
FIG. 4A illustrates the package of FIG. 4 having top and bottom exposed leads with molding at the bottom corners.
Figure 4B:
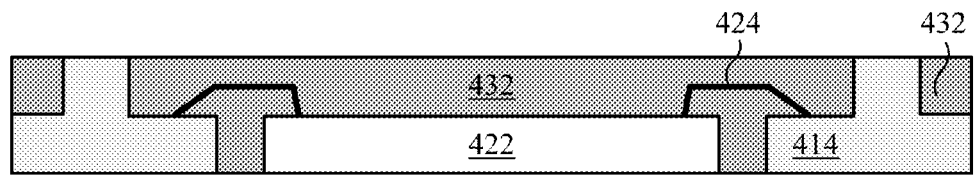
FIG. 4B illustrates the package of FIG. 4 having top and bottom exposed leads with molding at the top corners.

FIG. 4 includes top, bottom, and side (cross section) views of the package 400. FIGS. 4A and 4B illustrate additional side (cross section) views of alternatives for the leads 414 of different embodiments.

More specifically, FIG. 4A illustrates the package 400 of FIG. 4 having top and bottom exposed leads 414 with molding 432 at the bottom corners of the package 400.

FIG. 4B illustrates the package 400 of FIG. 4 having top and bottom exposed leads 414 with molding 432 at the top corners. The alternative configurations for the molding 432 illustrated in FIGS. 4, 4A and 4B, are generated by using certain variations in the steps of the processes (100, 200, 300) described above. These variations are further discussed below in relation to FIG. 28. The variations of the package design shown in FIGS. 4A and 4B are useful for having the molding 432 better anchor the lead frame within the package resin.

Figure 5:
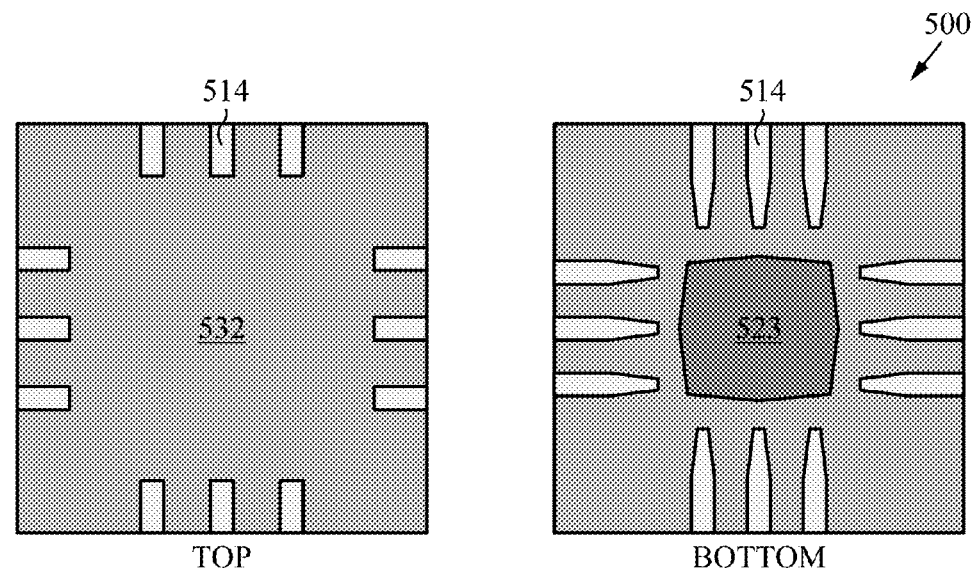
Figure 5A:
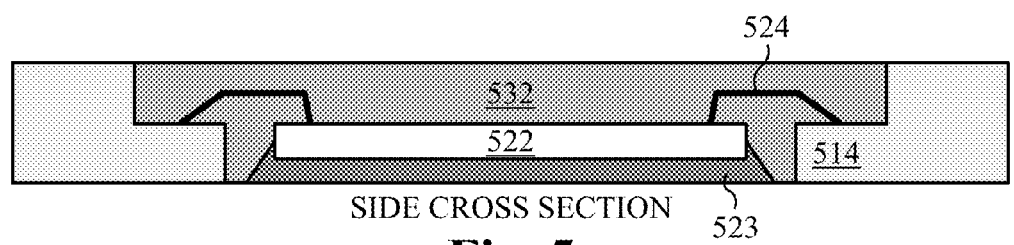
FIG. 5A illustrates the package of FIG. 5 having top and bottom exposed leads with molding at the bottom corners.
Figure 5B:
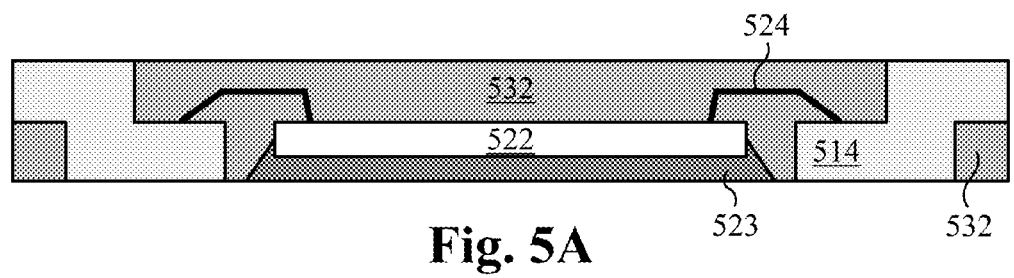
FIG. 5B illustrates the package of FIG. 5 having top and bottom exposed leads with molding at the top corners.

FIG. 5 illustrates the package of FIG. 4 with the die 522 on top of an adhesive layer 523. Hence some embodiments, employ a variation of the process 200 of FIG. 2 described above, to produce the package 500 illustrated in FIG. 5. Similarly, FIG. 5A illustrates the package 500 of FIG. 5 having top and bottom exposed leads 514 with molding 532 at the bottom corners of the package 500. FIG. 5B illustrates the package 500 of FIG. 5 having top and bottom exposed leads 514 with molding 532 at the top corners.

Figure 6:
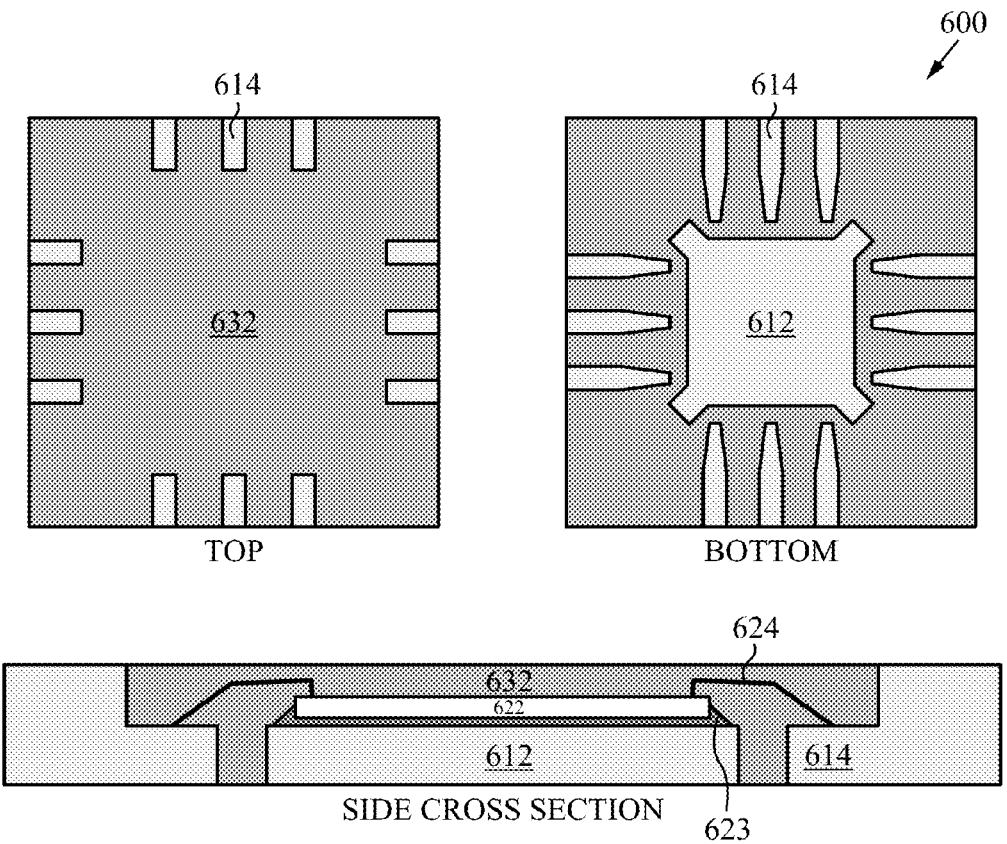

FIG. 6 illustrates the package of FIG. 5 with the die attach solder 623 coupling the die 622 to a die pad 612. Since the package 600 of FIG. 6 includes a die pad 612, some embodiments employ the process 100 described above in relation to FIG. 1, to produce the package 600 of FIG. 6.

Figure 6A:
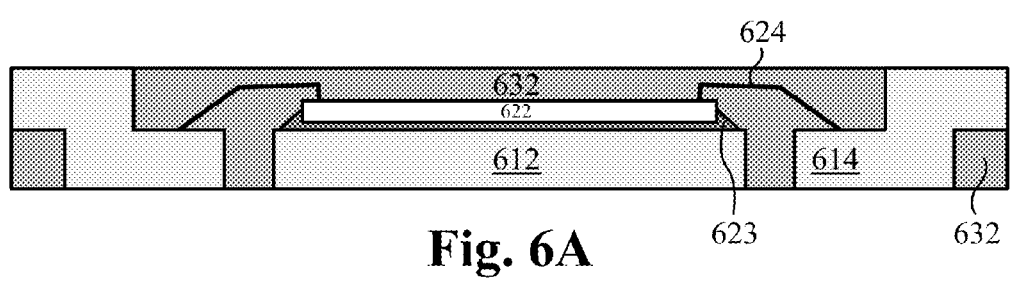
FIG. 6A illustrates the package of FIG. 6 having top and bottom exposed leads with molding at the bottom corners.
Figure 6B:
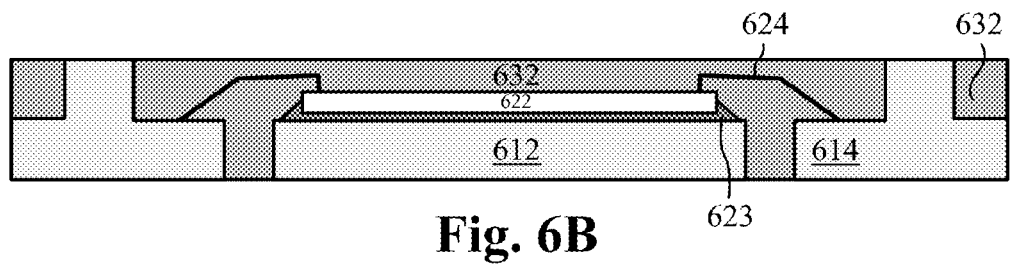
FIG. 6B illustrates the package of FIG. 6 having top and bottom exposed leads with molding at the top corners.

FIG. 6A illustrates the package 600 of FIG. 6 having top and bottom exposed leads 614 with molding 632 at the bottom corners. FIG. 6B illustrates the package 600 of FIG. 6 having top and bottom exposed leads 614 with molding at the top corners.

Figure 7:
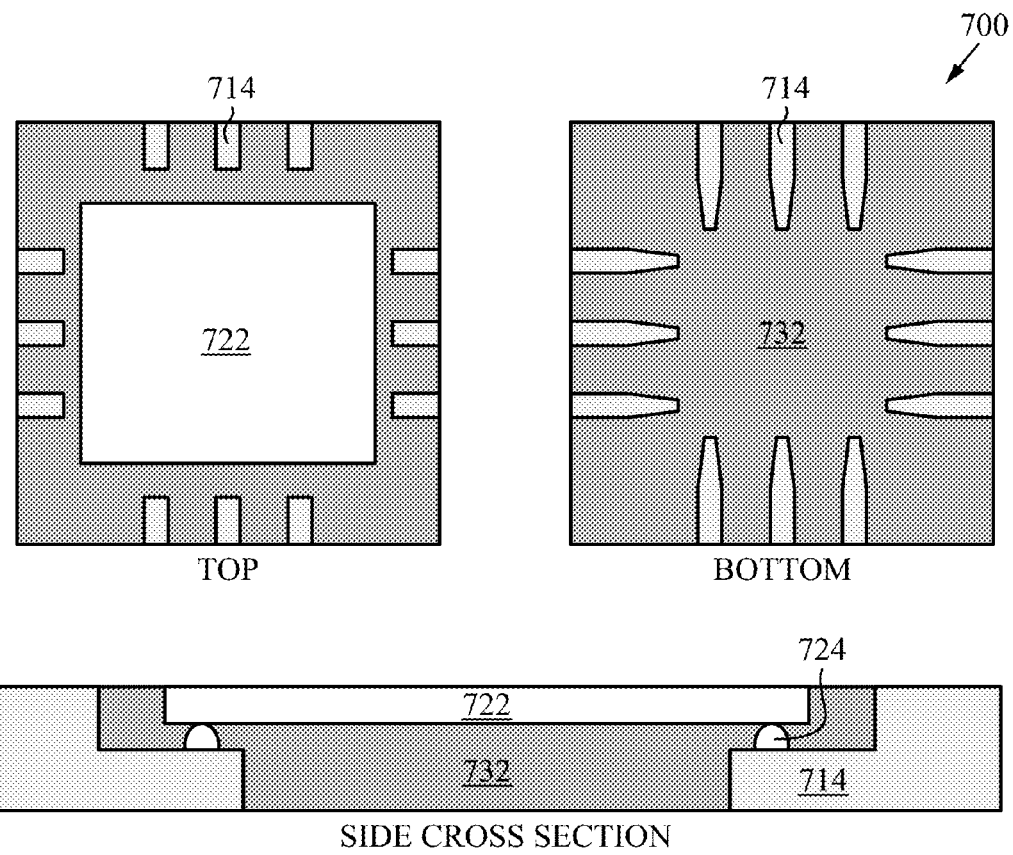

FIG. 7 illustrates a flip chip style package 700 with the die 722 coupled to the leads 714 via solder balls 724 (instead of bond wires). As shown in this figure, the surface of the die 722 that is opposite the solder balls, is exposed at the top of the package 700. By exposing the die 722, there is enhanced heat removal from the die 722. Since the package 700 utilizes the flip chip style of packaging, some embodiments employ a variation of the process 300 described above in relation to FIG. 3, to produce the package 700.

Figure 7A:
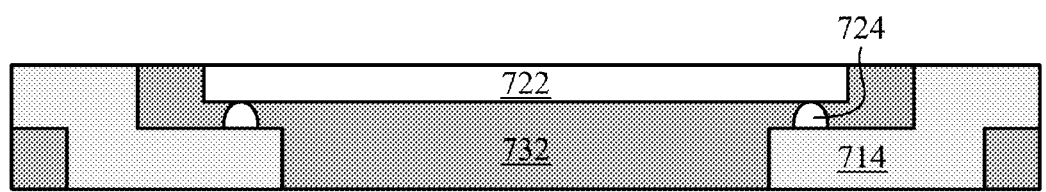
FIG. 7A illustrates the package of FIG. 7 having top and bottom exposed leads with molding at the bottom corners.
Figure 7B:
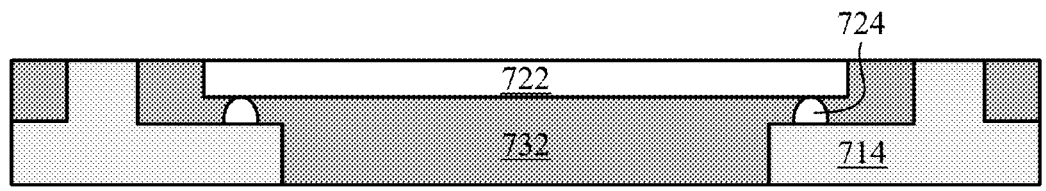
FIG. 7B illustrates the package of FIG. 7 having top and bottom exposed leads with molding at the top corners.

FIG. 7A illustrates the package 700 of FIG. 7 having top and bottom exposed leads 714 with molding 732 at the bottom corners. FIG. 7B illustrates the package 700 of FIG. 7 having top and bottom exposed leads 714 with molding 732 at the top corners.

Figure 8:
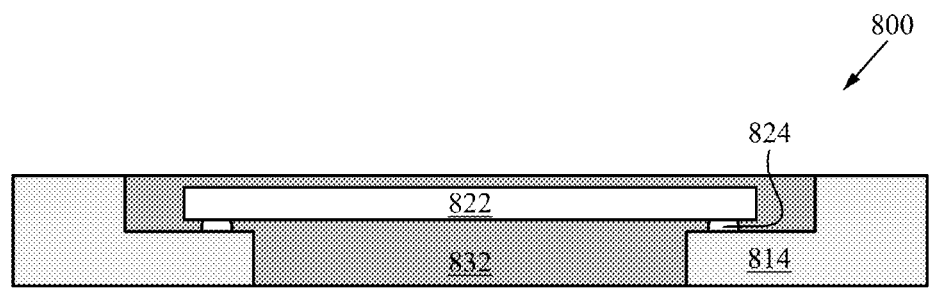
Figure 8A:
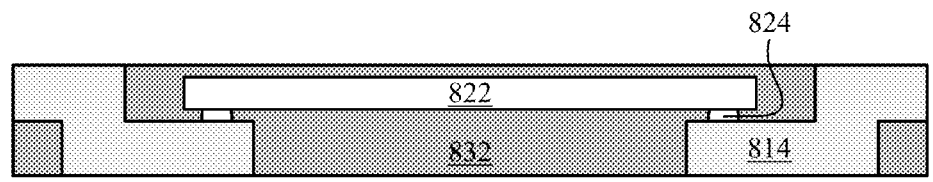
FIG. 8A illustrates the package of FIG. 8 having top and bottom exposed leads with molding at the bottom corners.
Figure 8B:
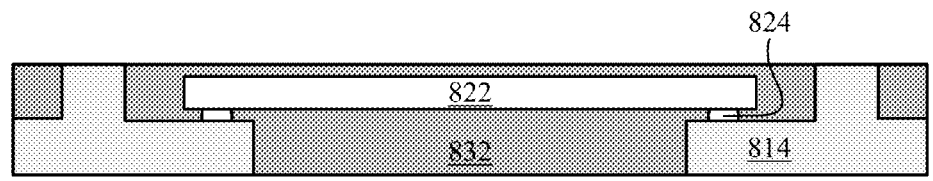
FIG. 8B illustrates the package of FIG. 8 having top and bottom exposed leads with molding at the top corners.

FIG. 8 illustrates the flip chip package of FIG. 7, without the die 822 exposed. The die 822 is coupled to the leads 814 using solder bumps or pillar bumps 824. FIG. 8A illustrates the package 800 of FIG. 8 having top and bottom exposed leads 814 with molding 832 at the bottom corners. FIG. 8B illustrates the package 800 of FIG. 8 having top and bottom exposed leads 814 with molding 832 at the top corners.

Figure 9:
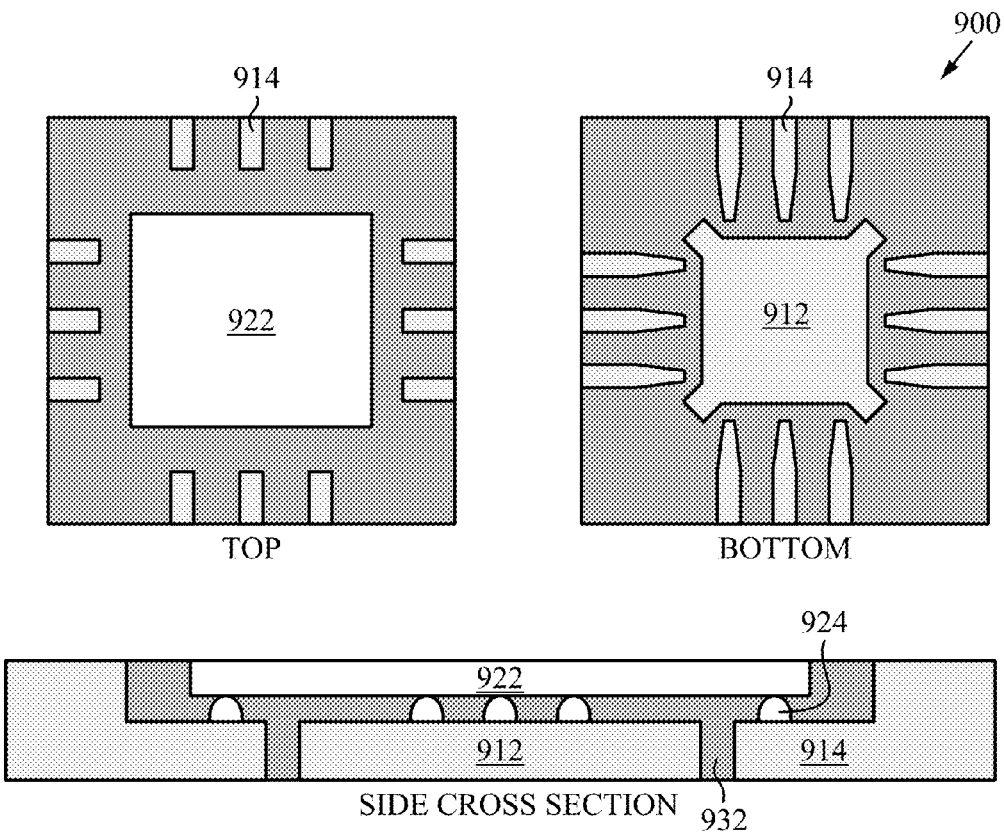
Figure 9A:
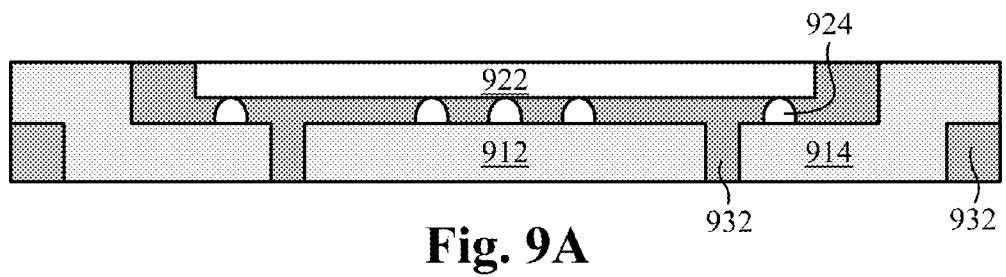
FIG. 9A illustrates the package of FIG. 8 having top and bottom exposed leads with molding at the bottom corners.
Figure 9B:
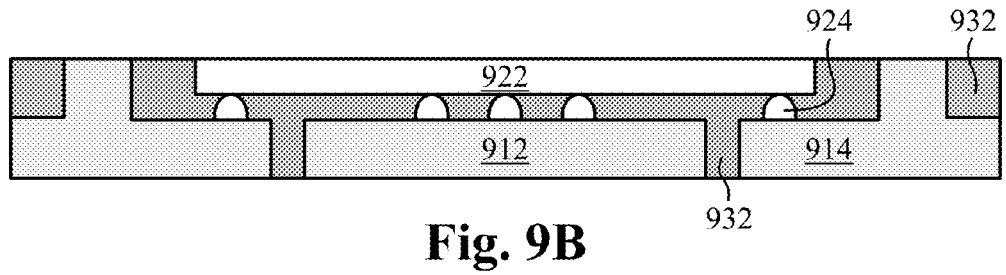
FIG. 9B illustrates the package of FIG. 8 having top and bottom exposed leads with molding at the top corners.

FIG. 9 illustrates the flip chip package of FIG. 7, with a (top) exposed die 922 that is coupled via solder balls 924 to a die pad 912 that is exposed at the bottom of the package 900. FIG. 9A illustrates the package 900 of FIG. 9 having top and bottom exposed leads 914 with molding 932 at the bottom corners. FIG. 9B illustrates the package of FIG. 9 having top and bottom exposed leads 914 with molding 932 at the top corners.

Figure 10:
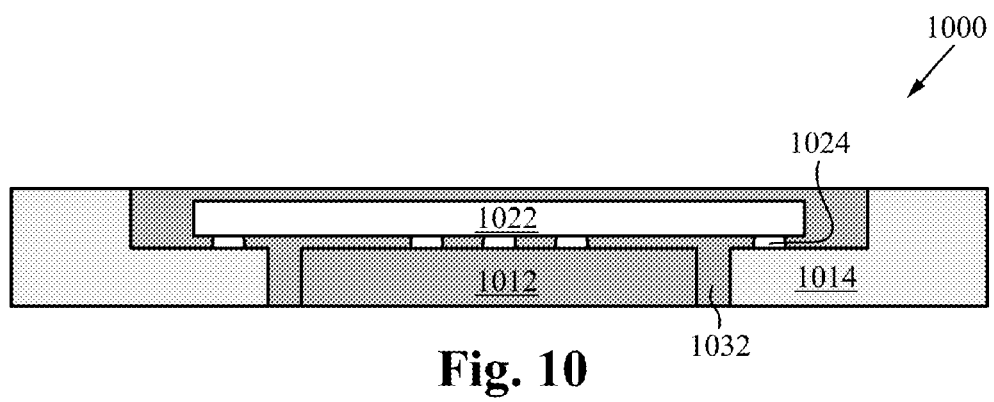
Figure 10A:
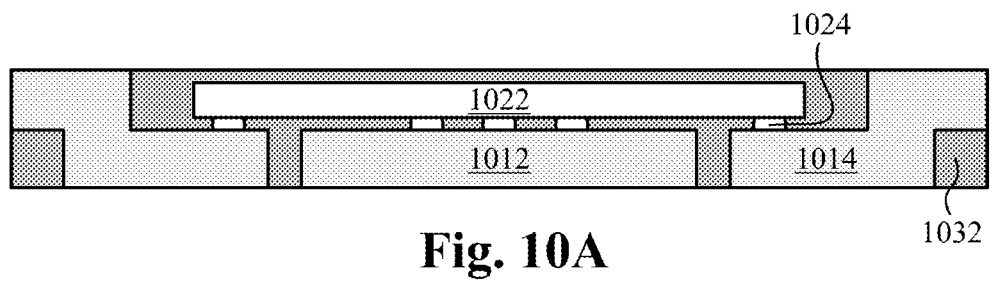
FIG. 10A illustrates the package of FIG. 10 having top and bottom exposed leads with molding at the bottom corners.
Figure 10B:
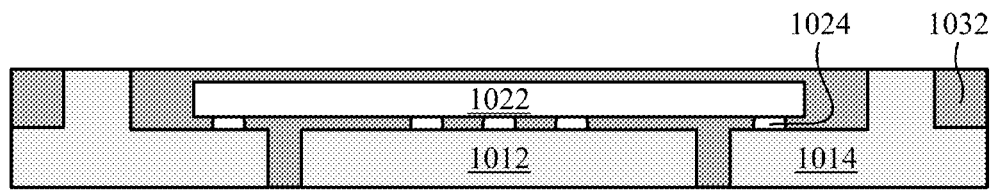
FIG. 10B illustrates the package of FIG. 10 having top and bottom exposed leads with molding at the top corners.

FIG. 10 illustrates the package of FIG. 9, where the die 1022 is not exposed at the top of the package 1000. FIG. 10A illustrates the package 1000 of FIG. 10 having top and bottom exposed leads 1014 with molding 1032 at the bottom corners. FIG. 10B illustrates the package 1000 of FIG. 10 having top and bottom exposed leads 1014 with molding 1032 at the top corners.

Figure 11:
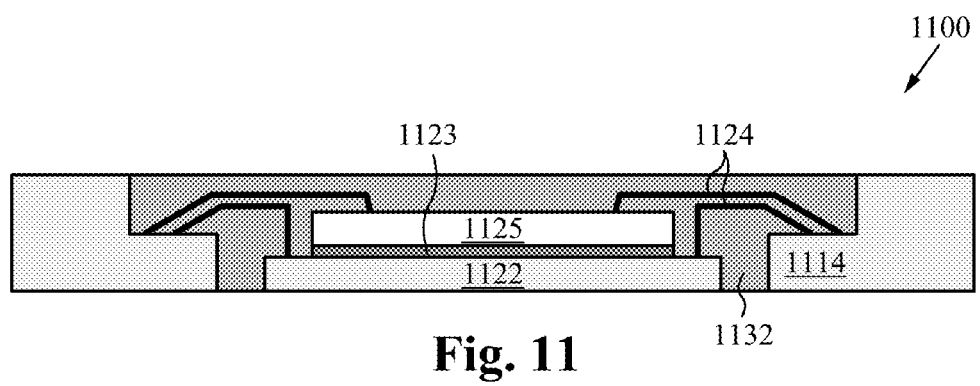
Figure 11A:
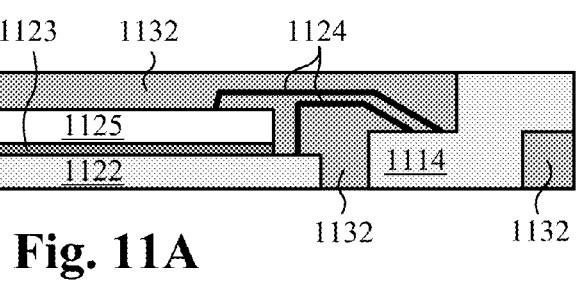
FIG. 11A illustrates the package of FIG. 11 having top and bottom exposed leads with molding at the bottom corners.
Figure 11B:
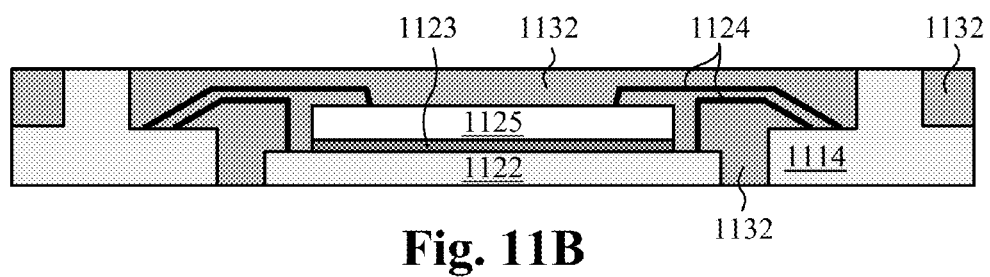
FIG. 11B illustrates the package of FIG. 11 having top and bottom exposed leads with molding at the top corners.

FIG. 11 illustrates a stacked die implementation 1100 with top and bottom exposed leads 1114 wire bonded (via bond wires 1124) to each of two dice 1122 and 1125. FIG. 11A illustrates the package 1100 of FIG. 11 having top and bottom exposed leads 1114 with molding 1132 at the bottom corners. FIG. 11B illustrates the package 1100 of FIG. 11 having top and bottom exposed leads 1114 with molding 1132 at the top corners.

As shown in FIG. 11, some embodiments support multi and/or stack die implementation of a low profile package. Some embodiments further enable implementation of multiple low profile packages in a stacked or "package-on-package" configuration. These configurations have additional particular features. For instance, some of embodiments include exposed die and/or exposed leads at one or more surfaces of the low profile packages, which permit access to specific locations within the package, though the package is stacked, and/or to facilitate the stacking of the package. These features are further described in relation to the figures below. The examples in FIGS. 4-11 are by no means exhaustive, many further variations are possible within the spirit and scope of the present invention.

III. Exemplary Stacked or Package-on-Package Configurations

Since the exemplary packages 400-1100 described above in relation to FIGS. 4-11 have numerous advantages, including small form factor and/or low profile dimensions, the processes (100, 200, 300) and packages 400-1100 have further advantages when implemented and/or embodied in combination. Such embodiments include stacked and/or package-on-package configurations, for example. FIGS. 12-25 illustrate stacked or package-on-package (PoP) implementations employing some of the packages described above.

Figure 12:
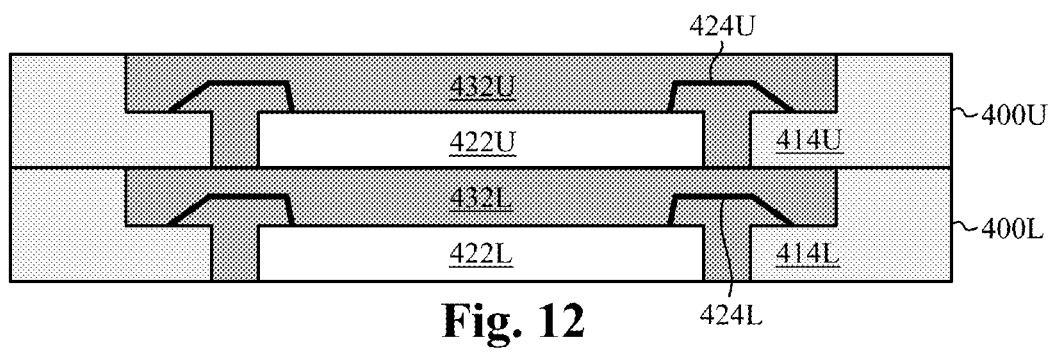

In particular, FIG. 12 illustrates two of the packages 400 of FIG. 4 in a stacked or package-on-package configuration. As shown in this figure, the two packages 400U (upper) and 400L (lower) are stacked vertically such that the top of the exposed leads 414L of the lower package 400L abuts the bottom of the exposed leads 414U of the upper package 400U. However, the other features of this embodiment, such as the dice 422 and bond wires 424 are kept separated by the molding 432. Advantageously, some embodiments provide for electrical, thermal, and/or other communication between the leads 414U and 414L.

Figure 13:
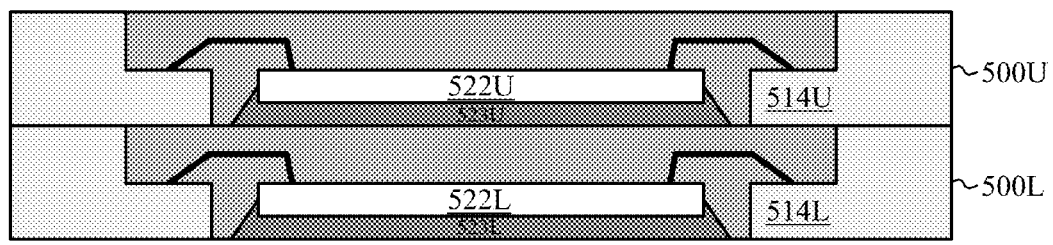

Similarly, FIG. 13 illustrates two of the packages 500U and 500L of FIG. 5 in a stacked configuration with the exposed surfaces of the leads 514U and 514L adjacent.

Figure 14:
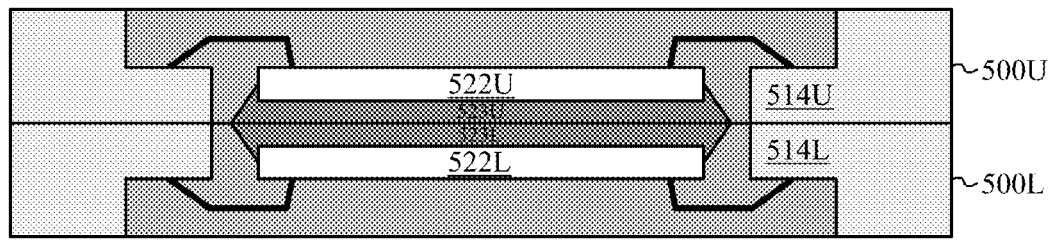

FIG. 14 illustrates the package 500U of FIG. 5 stacked on top of another package 500L of FIG. 5. However, the lower package 500L has been inverted such that the bottom of the lower package 500L abuts the bottom of the upper package 500U. In this configuration, the bottom exposed die adhesive 523U and 523L of the two packages 500U and 500L are facing and/or optionally coupled. Moreover, the bottom surfaces of the exposed lead 514U and 514L are adjacent.

Figure 15:
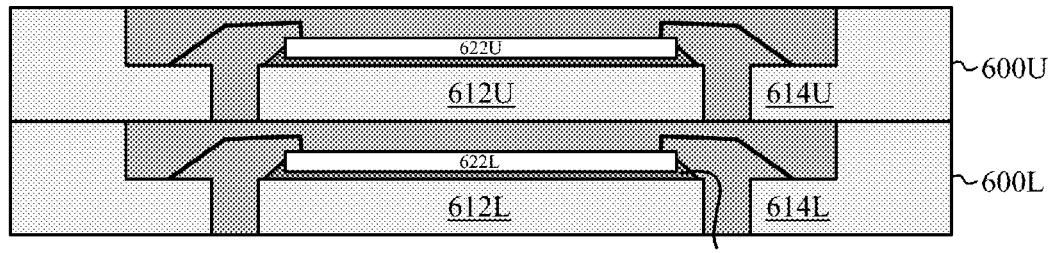

FIG. 15 illustrates two of the packages 600 of FIG. 6 in a stacked configuration.

Figure 16:

FIG. 16 illustrates an inverted package 600U of FIG. 6 stacked on top of an uninverted package 600L of FIG. 6 such that the top surfaces of the two packages (600U and 600L) are abutting. In this configuration, the tops of the exposed leads 614U and 614L are abutting and/or in communication with each other. As mentioned above, the communication includes electrical, thermal, or other advantageous communication.

Figure 17:
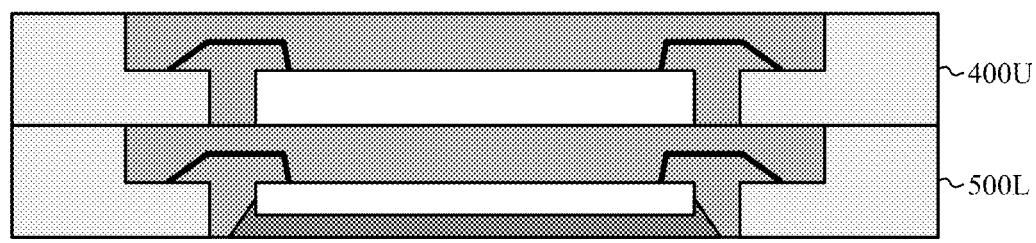
Figure 18:
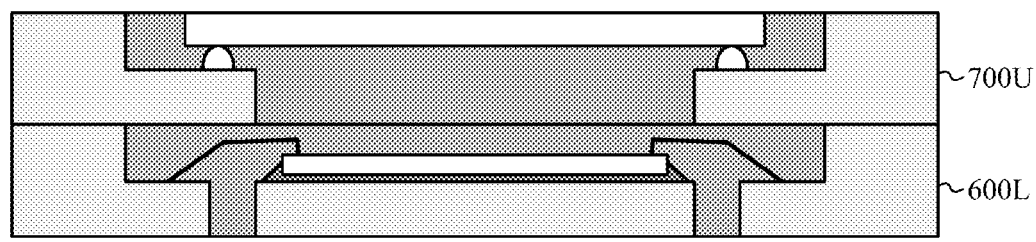
Figure 19:
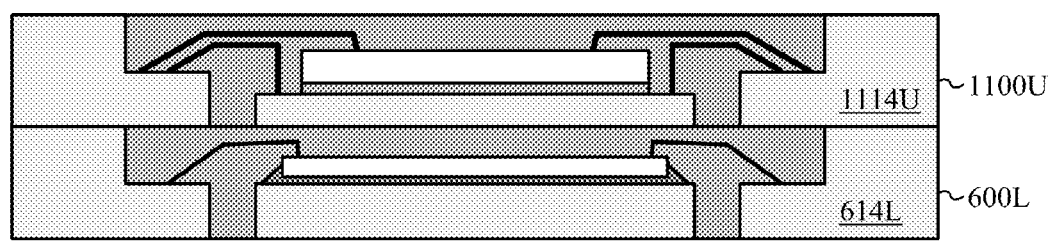

The individual packages of a multi, stacked, or package-on-package configuration includes the same and/or different styles and types. For instance, FIG. 17 illustrates the package 400U of FIG. 4 stacked on top of the package 500L of FIG. 5. In another instance, FIG. 18 illustrates the package 700U of FIG. 7 stacked on top of the package 600L of FIG. 6. Further, FIG. 19 illustrates the package 1100U of FIG. 11 stacked on top of the package 600L of FIG. 6.

Figure 20:
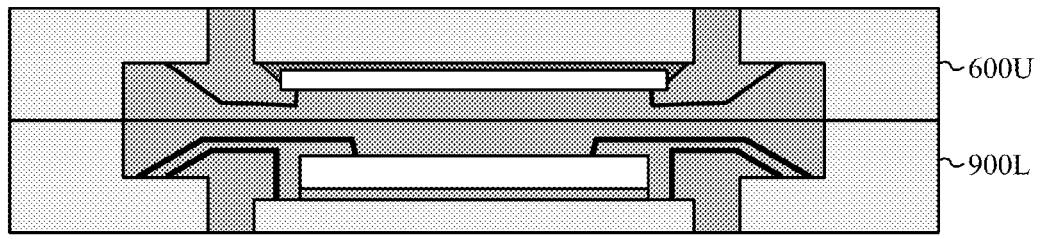
Figure 21:
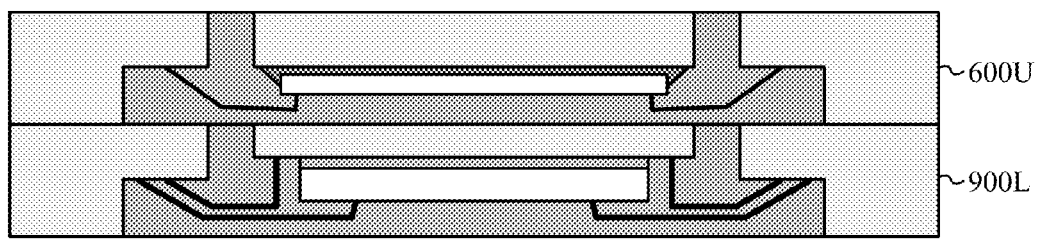
Figure 22:
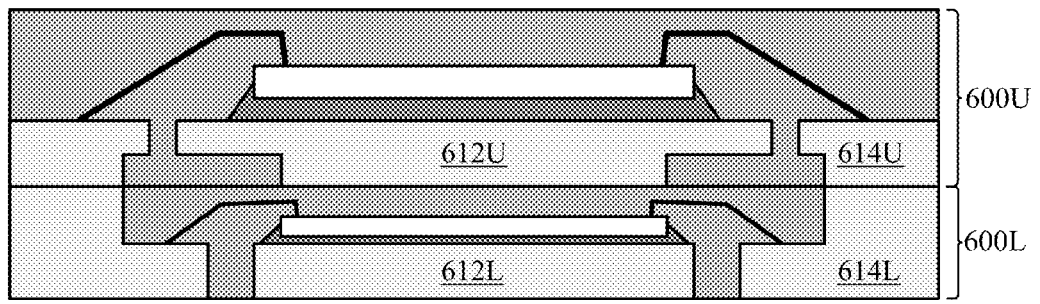

In additional configurations, FIG. 20 illustrates the package 600U of FIG. 6 inverted and stacked on top of the package 1100U of FIG. 11 such that the top surfaces of the two packages 600U and 900L are abutting. FIG. 21 illustrates the package 600U of FIG. 6 inverted and stacked on top of the inverted package 1100U of FIG. 11. FIG. 22 illustrates a variation of the package 600U of FIG. 6 stacked on top of the package 600L of FIG. 6. As shown in this figure, the package 600U has a die pad 612U and/or leads 614U that have a particular shape. The particular shapes are optionally formed by variations during the processes 100, 200 and/or 300, of FIGS. 1, 2 and 3, respectively.

Figure 23:
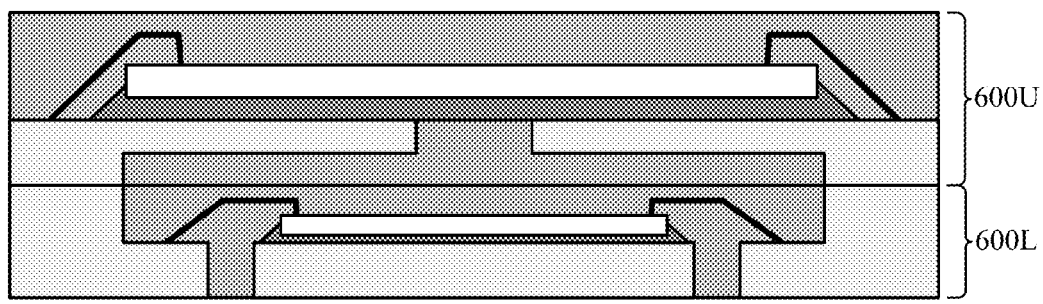
Figure 24:
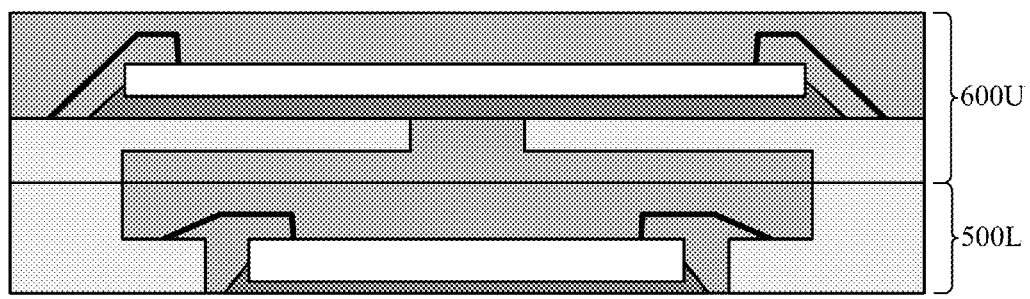

FIG. 23 illustrates another variation of the package 600U of FIG. 6 stacked on top of the package 600L of FIG. 6. Similar to FIG. 23, FIG. 24 illustrates the variation of the package 600U of FIG. 6 stacked on top of the package 500L of FIG. 5.

Figure 25:
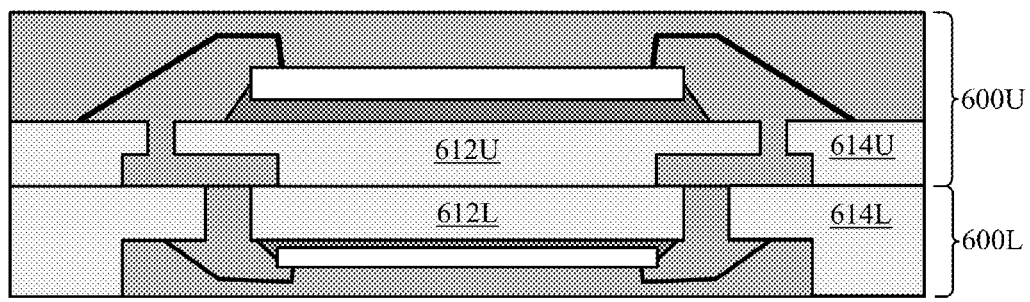

Similar to FIG. 22, FIG. 25 illustrates a variation for package 600U of FIG. 6 stacked on top of the package 600L of FIG. 6. In FIG. 25, the lower package 600L is inverted such that the exposed surfaces of both the dice 612U and 612L, and the leads 614U and 614L, are abutting.

Figure 26:
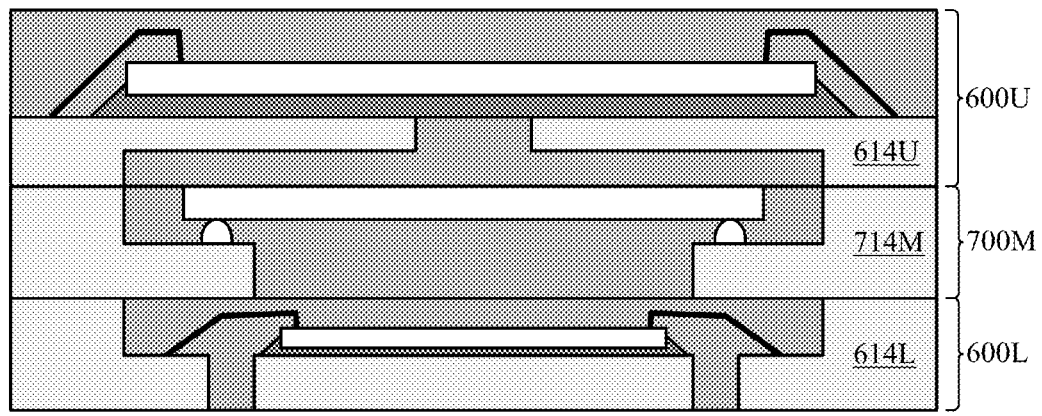
FIG. 26 illustrates the package of FIG. 6D stacked on top of the package of FIG. 7, which is stacked on top of the package of FIG. 6.

Further, the package-on-package configurations described above are not limited to two stacked packages. For instance, FIG. 26 illustrates a variation of the package 600U of FIG. 6 stacked on top of the package 700M of FIG. 7, which is stacked on top of the package 600L of FIG. 6. In these embodiments, since the middle package 700M has leads 714M that are exposed both top and bottom, the leads 614U, 714M and 614L of all three packages (upper 600U, middle 700M, and lower 600L) are advantageously in communication with each other.

Figure 27:
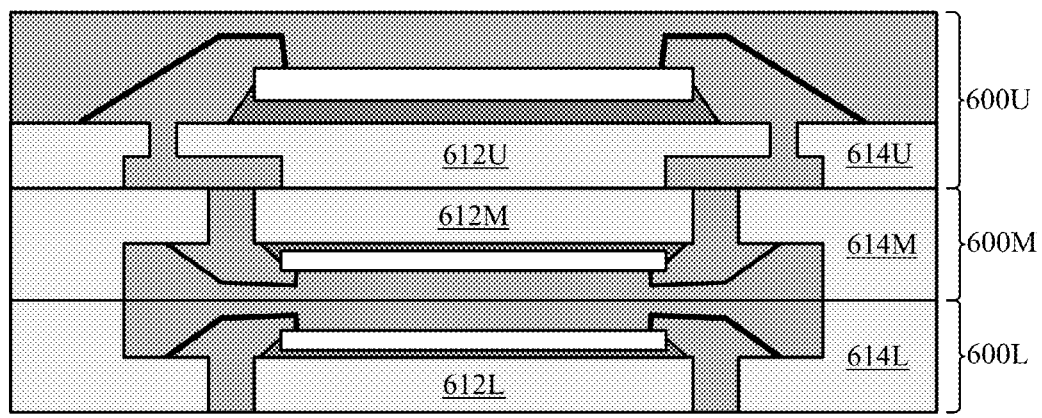
FIG. 27 illustrates the package of FIG. 6C stacked on top of the inverted package of FIG. 6, which is stacked on top of the uninverted package of FIG. 6.

Similarly, FIG. 27 illustrates a variation of the package 600U of FIG. 6 stacked on top of the inverted package 600M of FIG. 6, which is stacked on top of the uninverted package 600L of FIG. 6. As shown in this figure, the leads 614U, 614M, and 614L, are all in communication. Further, the die pads 612U and 612M of the upper 600U and middle 600M packages are also facing and/or in communication with each other. The examples in FIGS. 12-27 are by no means exhaustive, many further variations are possible within the spirit and scope of the present invention.

IV. Advantages

Figure 28:
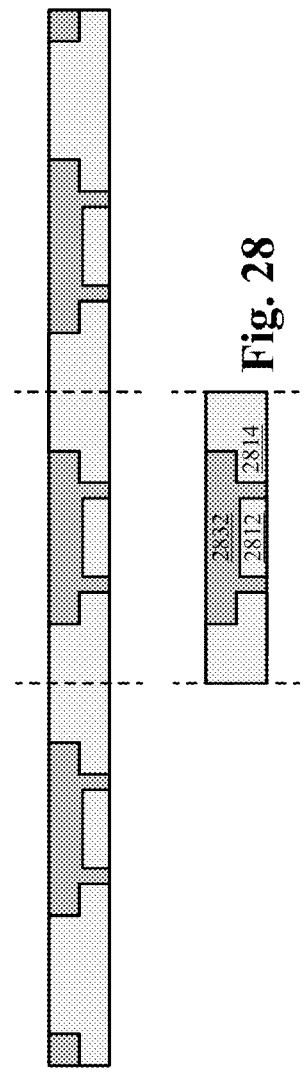
FIGS. 28, 28A and 28B illustrates a variety of different shaped leadframes and processes for singulation that form the leads of some embodiments.
Figure 28A:
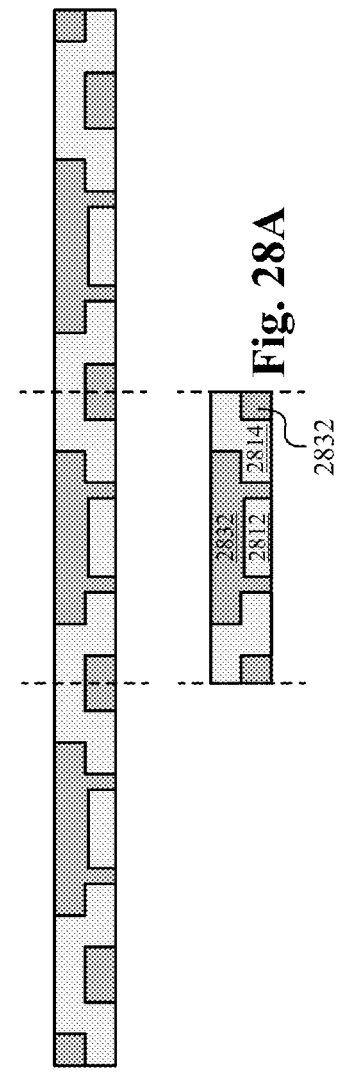
Figure 28B:
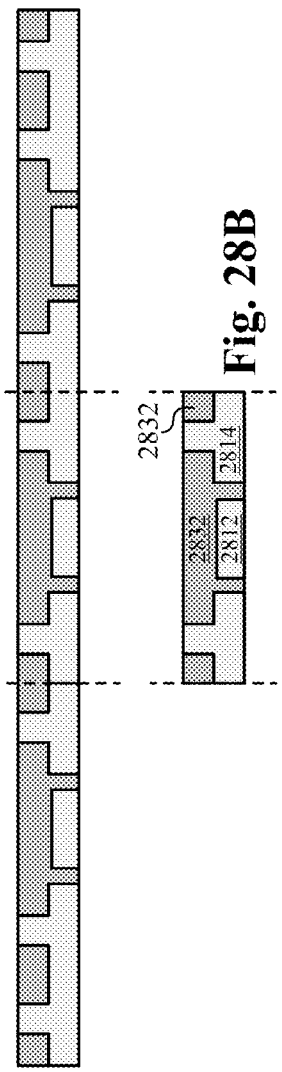

As mentioned above, the processes 100, 200 and 300 produce different packages each with different attributes and advantages. In each case the package is the same height as the lead frame. The process 200 produces packages without a die attach pad at the lead frame formation step 310. Some embodiments further provide variations in the packages at the lead frame formation step (110, 210, 310), or at another step, such as for example the singulation step (150, 250, 350). In particular, FIG. 28 illustrates a method by which some embodiments produce the package illustrated in FIG. 4. FIG. 28A illustrates a method by which some embodiments form the package illustrated in FIG. 4A. FIG. 28B illustrates a method by which some embodiments form the package illustrated in FIG. 4B. As shown in FIGS. 28, 28A and 28B, these embodiments form the singulated packages by using a variety of means, such as, for instance, by initially forming a lead frame having a variety of shapes. Then, the encapsulated lead frame(s) are singulated at different locations to produce the desired encapsulated shapes.

Further, FIGS. 4-27 illustrate various top, bottom, and/or side views for configurations in accordance with several embodiments of the invention. Some of these embodiments are formed by using the processes 100, 200, and/or 300 described above. As mentioned above, these packages 400-2700 have several advantages.

(1) For instance, as mentioned above, the processes (100, 200, 300) have fewer steps of fabrication than conventional methods known in the art. Because the processes (100, 200, 300) have fewer steps, they are less expensive than the processes known in the art. Moreover, because the processes (100, 200, 300) have fewer steps, they are also generally faster than other processes, or, in other words, have a higher throughput.

(2) The processes (100, 200, 300) are capable of yielding package sizes that are close to the dimensions of the packaged die inside the package. The advantages of reductions in package size are understood by those of ordinary skill. For example, a package having a footprint that is approximately its die size it will require a mounting area on a circuit board that is not much greater than approximately the size of the die. Thus, this advantage allows the placement of many more semiconductor devices on a board, or the use of a smaller circuit board, which further typically results in smaller form factor applications, and additional size and/or cost savings, such as from reduced shipping and manufacturing costs, for example.

(3) Further, a package having a thickness close to the die thickness encapsulated inside the package allows for lower profile implementations that use such small outline and/or low profile packages.

(4) Because the critical factor regarding height for the packages formed by the process 100, is typically the height of the die, or another factor, the height of the leads has no or negligible impact on the height of the package. Effectively, the leads have a zero, or almost zero, height in relation to the height of the package and/or the die.

(5) Additionally, because the process 100 has fewer steps, and its products are typically close in size to the small encapsulated die, the packages illustrated and described herein provide savings in the volume of construction materials consumed over time, or, in other words, provide a higher yield. Moreover, the various many possible package configurations enabled by the processes 100, 200, and 300 described above, yield further advantages.

While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A package comprising:
   a. a first semiconductor die;
   b. a formed lead frame having a plurality of formed leads each having a first end positioned near but spaced apart from the first semiconductor die and substantially in a first planar level, a second end substantially in the first planar level, and a middle section between the first end and the second end, wherein the middle section is substantially in a second planar level, wherein the second planar level is higher than the first planar level, wherein the second end is exposed to an edge of the package on a bottom and but not a top of the package;
   c. means for electrically coupling between at least one pad on the first semiconductor die and at least one of the first ends;
   d. a second semiconductor die stacked on and electrically insulated from the first semiconductor die wherein the second semiconductor die is electrically coupled to the at least one of the formed leads; and
   e. a resin formed around the first semiconductor die and between the leads such that the package has a thickness substantially equal to a thickness of the lead frame.

2. The package according to claim 1, wherein the lead frame and the package have a thickness in the range of 127 to 500 micro meters.

3. The package according to claim 1, wherein the second planar level is higher than the first planar level by an amount no more than an amount greater than a thickness of the first semiconductor die.

4. The package according to claim 1, wherein the second planar level is higher than the first planar level by at least a thickness of the first semiconductor die.

5. The package according to claim 1, wherein a back side of the semiconductor die is exposed between the first ends and the means for electrically coupling comprises wire bonds.

6. The package according to claim 1, further comprising a system formed by stacking at least two packages, such that the leads of one package are positioned adjacent to and are electrically coupled with the leads of the other package.

7. The package according to claim 1, further comprising a plated surface on the leads to enhance bonding.

8. The package according to claim 1, further comprising a plated surface on the lead frame to enhance board soldering.

9. The package according to claim 1, wherein the first and second planar levels are electrically exposed to an exterior surface of the package.

10. The package according to claim 1, wherein one or more bond wires electrically coupling the first semiconductor die to one or more of the formed leads have at least one bend forming a corner for minimizing the distance the one or more bond wires extend above the top of the first semiconductor die.

11. The package according to claim 1, further comprising molding at top corners for anchoring the lead frame within the resin.

12. The package according to claim 1, further comprising means for electrically coupling between at least one pad on the second semiconductor die and at least one of the first ends.

* * * * *